US012588182B2

(12) United States Patent
Wang et al.

(10) Patent No.: US 12,588,182 B2
(45) Date of Patent: Mar. 24, 2026

(54) MULTI-PORT SRAM CELL WITH METAL INTERCONNECT STRUCTURES

(71) Applicant: Taiwan Semiconductor Manufacturing Company, Ltd., Hsin-Chu (TW)

(72) Inventors: Ping-Wei Wang, Hsin-Chu (TW); Feng-Ming Chang, Hsinchu County (TW); Jui-Lin Chen, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 425 days.

(21) Appl. No.: 18/364,842

(22) Filed: Aug. 3, 2023

(65) Prior Publication Data

US 2024/0306359 A1 Sep. 12, 2024

Related U.S. Application Data

(60) Provisional application No. 63/489,201, filed on Mar. 9, 2023.

(51) Int. Cl.
*H10B 10/00* (2023.01)

(52) U.S. Cl.
CPC ................................. *H10B 10/125* (2023.02)

(58) Field of Classification Search
CPC .... H10B 10/125; H10B 10/12; G11C 7/1075; G11C 11/412
USPC .......................................................... 365/63
See application file for complete search history.

(56) References Cited

U.S. PATENT DOCUMENTS

| | | | |
|---|---|---|---|
| 8,605,523 B2 | 12/2013 | Tao et al. | |
| 8,630,132 B2 | 1/2014 | Cheng et al. | |
| 8,760,948 B2 | 6/2014 | Tao et al. | |
| 10,128,253 B2 * | 11/2018 | Liaw ......................... | G11C 8/16 |
| 11,094,685 B2 * | 8/2021 | Liaw ..................... | G11C 11/412 |
| 11,950,401 B2 * | 4/2024 | Liaw .................. | H10D 30/6219 |
| 2014/0032871 A1 | 1/2014 | Hsu et al. | |
| 2014/0153321 A1 | 6/2014 | Liaw | |

(Continued)

FOREIGN PATENT DOCUMENTS

| | | |
|---|---|---|
| DE | 102022100031 A1 | 9/2022 |
| KR | 20140080475 A | 6/2014 |

(Continued)

*Primary Examiner* — Fernando Hidalgo
(74) *Attorney, Agent, or Firm* — HAYNES AND BOONE, LLP

(57) ABSTRACT

A memory cell includes a device layer including a plurality of transistors and an interconnect structure disposed over the device layer. Each of the transistors includes a gate structure extending lengthwise in a first direction. The interconnect structure includes a bottommost metal line layer electrically coupled to the transistors in the device layer. The bottommost metal line layer includes metal lines arranged in first, second, third, fourth, fifth, and sixth metal tracks in order from first to sixth along the first direction. A distance between any adjacent two of the first, second, third, fourth, fifth, and six metal tracks measured along the first direction is uniform. The first metal track includes a metal line electrically coupled to an electric ground of the memory cell. The sixth metal track includes a metal line electrically coupled to a power supply of the memory cell.

20 Claims, 25 Drawing Sheets

(56)     References Cited

U.S. PATENT DOCUMENTS

| | | | |
|---|---|---|---|
| 2014/0153345 A1 | 6/2014 | Kim et al. | |
| 2014/0177352 A1 | 6/2014 | Lum | |
| 2014/0233330 A1 | 8/2014 | Ko et al. | |
| 2014/0241077 A1 | 8/2014 | Katoch et al. | |
| 2014/0269114 A1 | 9/2014 | Yang et al. | |
| 2016/0064068 A1 | 3/2016 | Mojumder | |
| 2018/0144788 A1* | 5/2018 | Liaw | G11C 11/417 |
| 2021/0202498 A1* | 7/2021 | Liaw | H01L 21/02603 |
| 2021/0366915 A1 | 11/2021 | Fujiwara | |
| 2024/0381612 A1* | 11/2024 | Liaw | G11C 11/413 |

FOREIGN PATENT DOCUMENTS

| | | | |
|---|---|---|---|
| TW | 200541081 A | 12/2005 | |
| TW | 200623137 A | 7/2006 | |
| TW | 202201731 A | 1/2022 | |

* cited by examiner

10

20

18

14

16

18

14

16

18

18

12

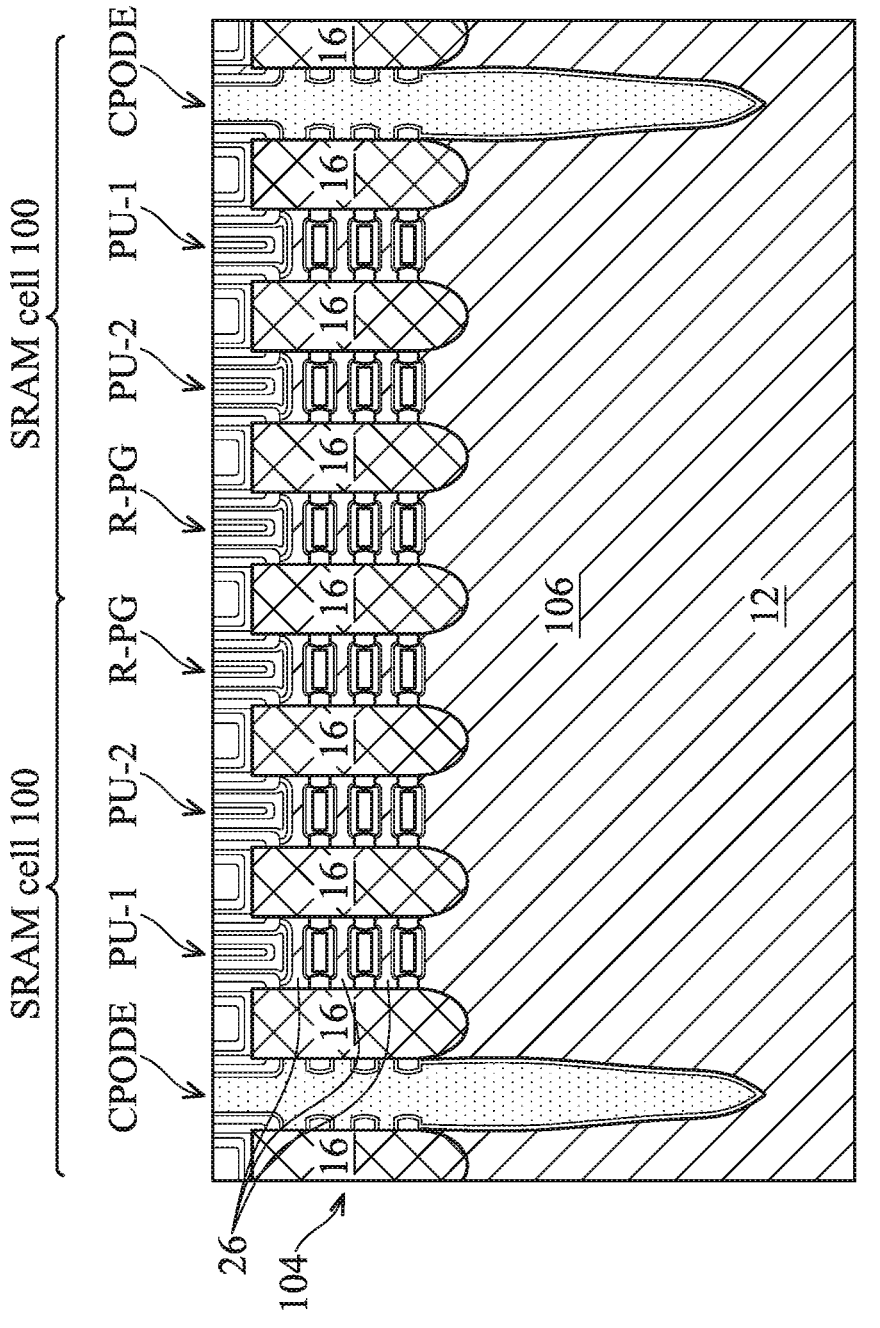
FIG. 7A
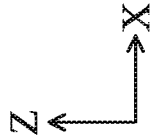

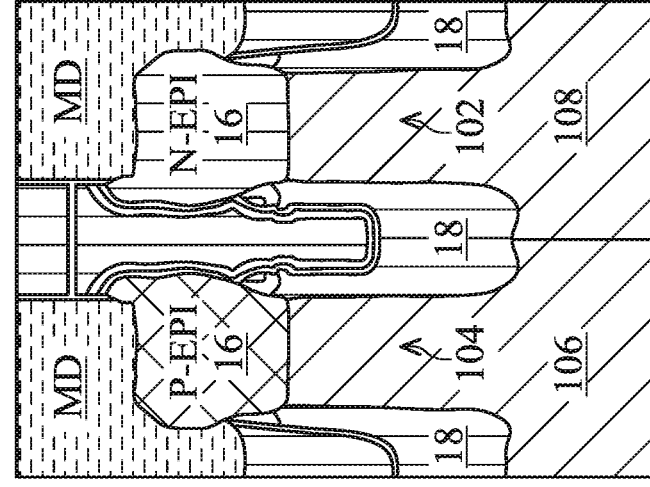
FIG. 7B
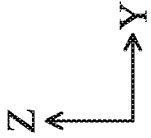

Figure 19:
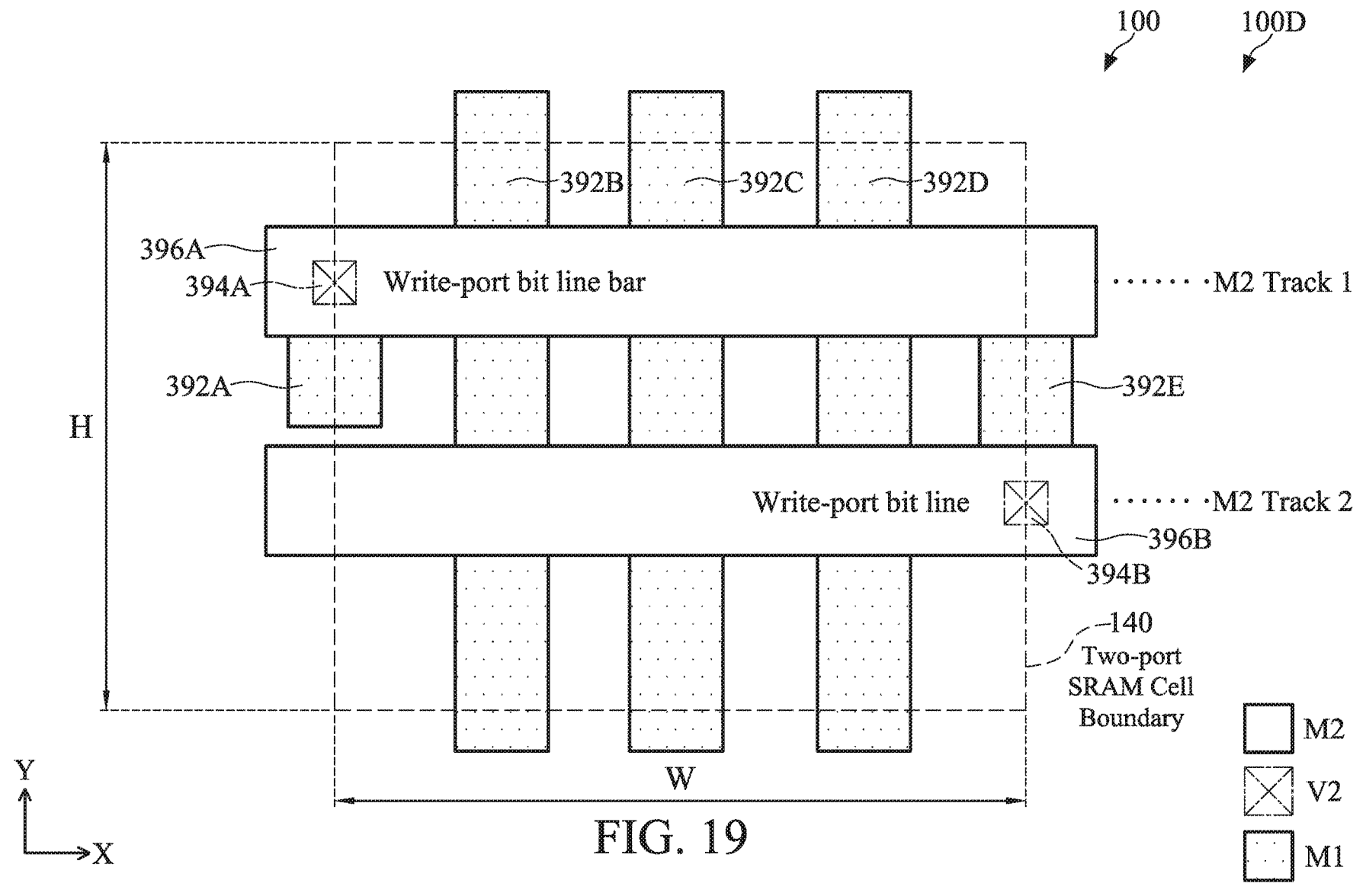

100D

100

M2 Track 1

M2 Track 2

M2

V2

M1

392E

396B

394B

140

Two-port
SRAM Cell
Boundary

392D

392C

392B

Write-port bit line

Write-port bit line bar

MULTI-PORT SRAM CELL WITH METAL INTERCONNECT STRUCTURES

PRIORITY DATA

This application claims priority to U.S. Provisional Patent Application No. 63/489,201 filed on Mar. 9, 2023, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Semiconductor memory is an electronic data storage device implemented on a semiconductor-based integrated circuit and has much faster access times than other types of data storage technologies. For example, static random-access memories (SRAM) devices are commonly used in integrated circuits. SRAM devices is popular in high-speed communication, image processing and system-on-chip (SOC) applications. A bit can be read from or written into the SRAM cell within a few nanoseconds, while access times for rotating storage such as hard disks is in the range of milliseconds.

When entering into deep sub-micron era, SRAM devices have become increasingly popular due to their lithography-friendly layout shapes of active regions, polysilicon lines, and metal layers. Among SRAM devices, multi-port SRAM devices have become popular. For example, a two-port (2P) SRAM device allows parallel operation, such as 1R (read) 1W (write), or 2R (read) in one cycle, and therefore has higher bandwidth than a single-port SRAM. However, in the deep sub-micron era, SRAM cells are generally large, particularly for multi-port SRAM cells due to insufficient area usage, such as insufficient area usage in device layer and metal interconnect structures. With the advancement of process nodes, there is a need for cell size reduction in multi-port SRAM cells.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7A and 7B illustrate diagrammatic cross-sectional views of a portion of the SRAM array as in FIGS. 5 and 6.

FIGS. 16, 17, 18, and 19 illustrate a third layout of metal interconnect structures of the two-port SRAM cell as in FIG. 3 at various contact and metal layers, in accordance with some embodiments of the present disclosure.

DETAILED DESCRIPTION

Figure 1A:
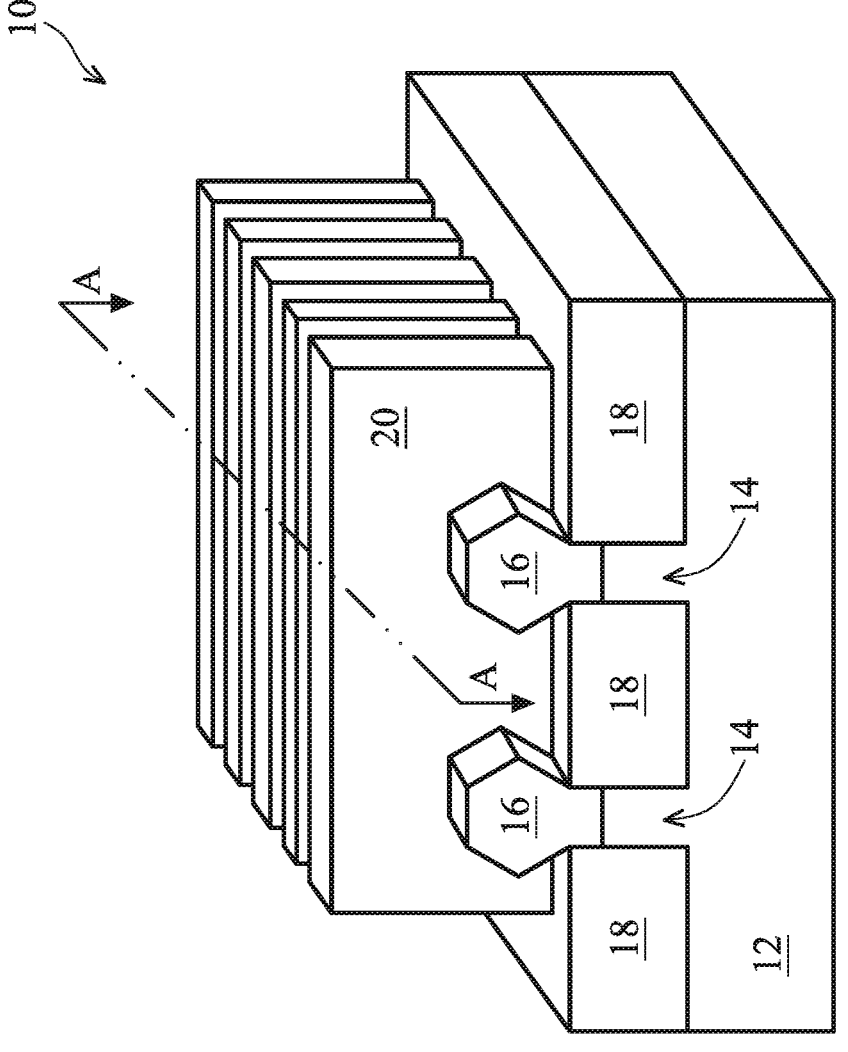
FIGS. 1A and 1B illustrate a perspective view and a top view of a portion of a memory device, respectively, in accordance with some embodiments of the present disclosure.
Figure 1A:
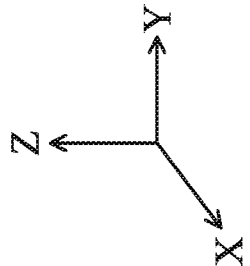

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to static random-access memories (SRAM) structures, more particularly, multi-port SRAM cells. An SRAM cell includes transistors with metal interconnect structures above the transistors. The metal interconnect structures include metal tracks (metal lines) for interconnecting transistor gates and source/drain regions, such as signal metal tracks for routing bit line and word line signals to the cell components, as well as power metal tracks for providing power to the cell components. An SRAM cell may include metal interconnect structures of multiple layers of metal tracks. For example, a first layer includes a plurality of first metal tracks formed over cell transistors, and a second layer is disposed over the first layer and includes a plurality of second metal tracks formed over the first metal tracks. The metal tracks in the same layer may be parallel to each other, or perpendicular to other metal tracks in adjacent parallel planes.

As transistor density increases, there is a need that the metal interconnect structures are scaled to provide sufficient power and signal routes to the increased number of transistors in a given space. However, due to process costs and limitations associated with mass production, electromigration rules, and other technical issues, the metal pitch of the metal interconnect structures does not scale with the underlying transistor size. Thus, the metal interconnect structures must have a reduced number of metal tracks within a given cell height. Accordingly, as the cell height decreases to accommodate an advanced node, the metal pitch of the metal pattern structures may fail to provide enough routing resources. Thus, minimum cell area (and chip area) cannot be achieved due to the metal pattern structure limitations.

The present disclosure provides exemplary circuits, in accordance with multi-port SRAM cell layout designs without design rule violations, for providing sufficient routing resources while accommodating a shorter cell height. In some embodiments, the layout designs indicate a two-port (2P) SRAM cell with less than seven metal zero (M0) tracks to fit within the cell height. With the higher area usage in the metal interconnect structures, a cell size reduction in multi-port SRAM cells is achieved.

Some exemplary embodiments are related to, but not otherwise limited to, multi-gate devices. Multi-gate devices have been introduced in an effort to improve gate control by increasing gate-channel coupling, reduce OFF-state current, and reduce short-channel effects (SCEs). One such multi-gate device that has been introduced is the fin-like field-effect transistor (FinFET). The FinFET gets its name from the fin-like structure which extends from a substrate on which it is formed, and which is used to form the FET channel. Another multi-gate device, introduced in part to address performance challenges associated with the FinFET, is the gate-all-around (GAA) transistor. The GAA transistor gets its name from the gate structure which can extend around the channel region (e.g., a stack of nanosheets) providing access to the channel on four sides. The GAA transistor is compatible with conventional complementary metal-oxide-semiconductor (CMOS) processes and its structure allows it to be aggressively scaled while maintaining gate control and mitigating SCEs. The following disclosure will continue with one or more GAA examples to illustrate various embodiments of the present disclosure. It is understood, however, that the application should not be limited to a particular type of device, except as specifically claimed. For example, aspects of the present disclosure may also apply to implementation based on Finfet or planar FETs.

The details of the device structures of the present disclosure are described in the attached drawings. The drawings have outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

Figure 1B:
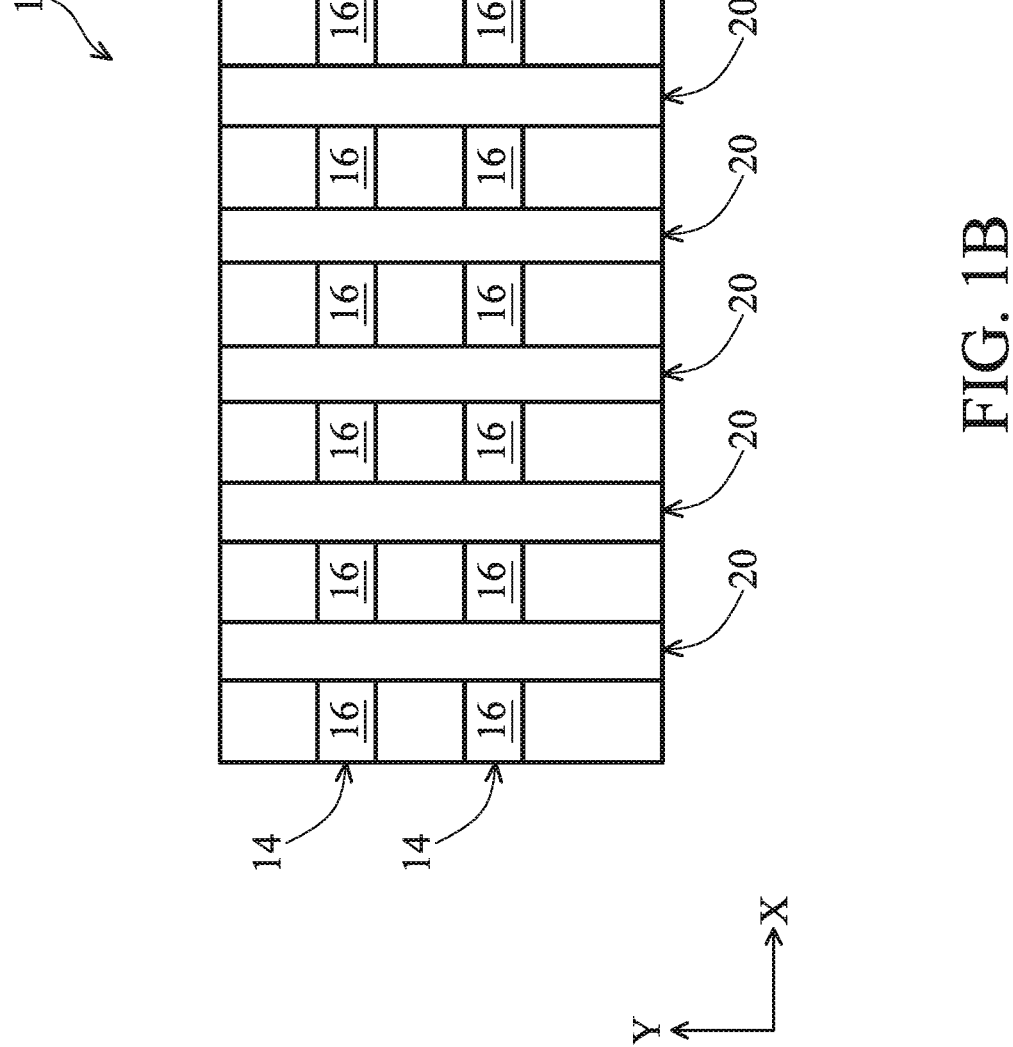

FIGS. 1A and 1B illustrate a perspective view and a top view, respectively, of a portion of an Integrated Circuit (IC) device 10, such as an SRAM device, that is implemented using GAA transistors. Referring to FIG. 1A, the IC device 10 includes a substrate 12. The substrate 12 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 12 may be a single-layer material having a uniform composition. Alternatively, the substrate 12 may include multiple material layers having similar or different compositions suitable for IC device manufacturing. In one example, the substrate 12 may be a silicon-on-insulator (SOI) substrate having a semiconductor silicon layer formed on a silicon oxide layer. In another example, the substrate 12 may include a conductive layer, a semiconductor layer, a dielectric layer, other layers, or combinations thereof. Various doped regions, such as source/drain (S/D) regions, may be formed in or on the substrate 12. The doped regions may be doped with n-type dopants, such as phosphorus or arsenic, and/or p-type dopants, such as boron, depending on design requirements. The doped regions may be formed directly on the substrate 12, in a p-well structure, in an n-well structure, in a dual-well structure, or using a raised structure. Doped regions may be formed by implantation of dopant atoms, in-situ doped epitaxial growth, and/or other suitable techniques.

Figure 2:
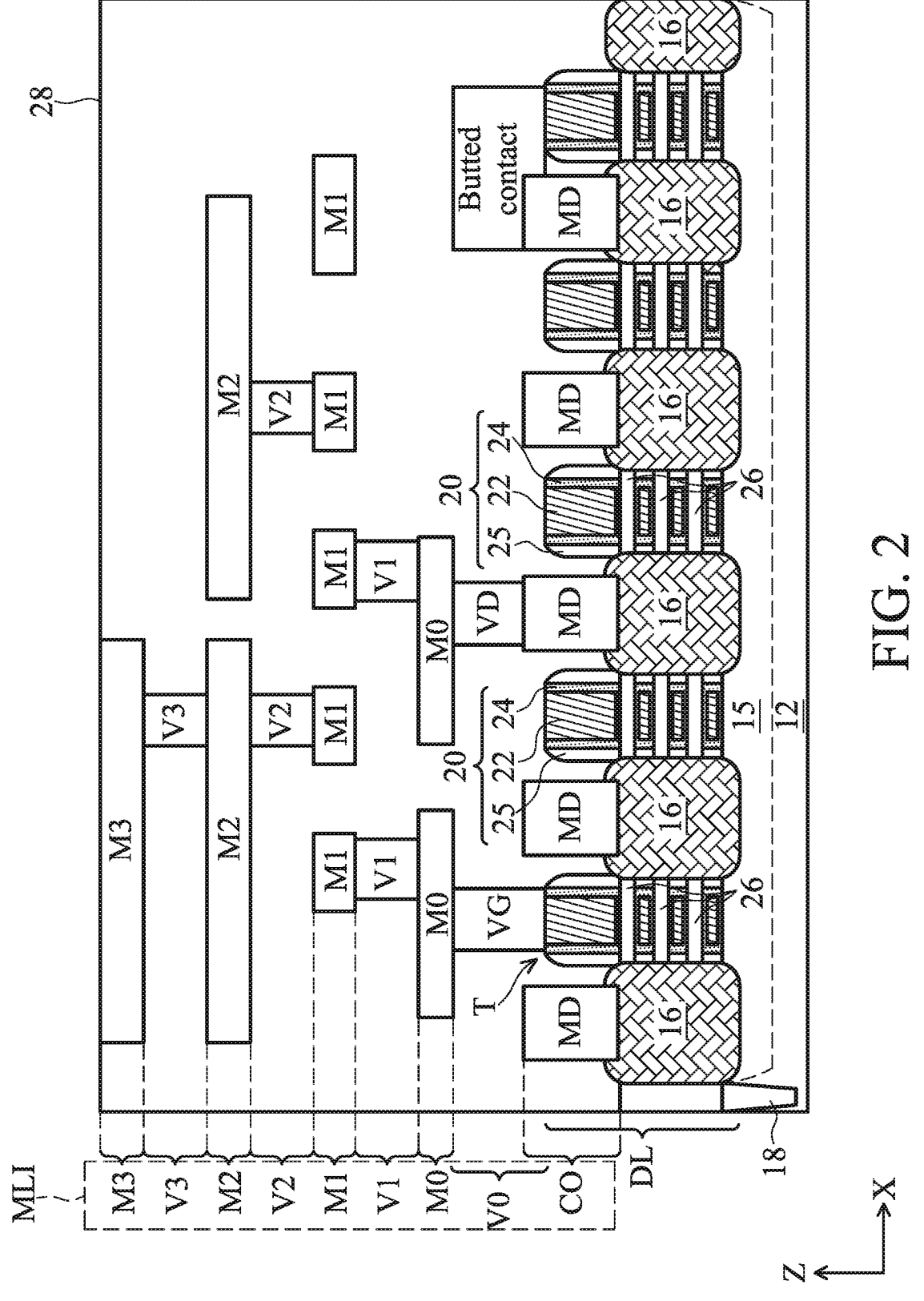
FIG. 2 illustrates a cross-sectional view of various layers of a memory device, in accordance with some embodiments of the present disclosure.

Three-dimensional active regions 14 are formed on the substrate 12. An active region for a transistor refers to the area where a source region, a drain region, and a channel region under a gate structure of the transistor are formed. An active region is also referred to as an "oxide-definition (OD) region" in the context. Each of the active regions 14 includes elongated nanostructures 26 (as shown in FIG. 2) vertically stacked in channel regions defined in the active region and above a fin-shape base. The fin-shape base protrudes upwardly out of the substrate 12. Source/drain features 16 are formed in source/drain regions defined in the active region and over the fin-shape base. The source/drain features 16 abut two opposing ends of the nanostructures 26. The source/drain features 16 may include epi-layers that are epitaxially grown on the fin-shape base.

The IC device 10 further includes isolation structures (or isolation features) 18 formed over the substrate 12. The isolation structures 18 electrically separate various components of the IC device 10. The isolation structures 18 may include silicon oxide, silicon nitride, silicon oxynitride, fluoride-doped silicate glass (FSG), a low-k dielectric material, and/or other suitable materials. In some embodiments, the isolation structures 18 may include shallow trench isolation (STI) features. In one embodiment, the isolation structures 18 are formed by etching trenches in the substrate 12 during the formation of the active regions 14. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 18. Alternatively, the isolation structures 18 may include a multi-layer structure, for example, having one or more thermal oxide liner layers.

The IC device 10 also includes gate structures (or gate stacks) 20 formed over and engaging the active regions 14. The gate structures 20 may be dummy gate structures (e.g., containing an oxide gate dielectric and a polysilicon gate electrode), or they may be high-k metal gate (HKMG) structures that contain a high-k gate dielectric and a metal gate electrode, where the HKMG structures are formed by replacing the dummy gate structures. Though not depicted herein, the gate structures 20 may include additional material layers, such as an interfacial layer, a capping layer, other suitable layers, or combinations thereof.

Referring to FIG. 1B, multiple active regions 14 are oriented lengthwise along the X-direction, and multiple gate structures 20 are oriented lengthwise along the Y-direction, i.e., generally perpendicular to the active regions 14. At intersections of the active regions 14 and the gate structures 20, transistors are formed. In many embodiments, the IC device 10 includes additional features such as gate spacers disposed along sidewalls of the gate structures 20, and numerous other features.

FIG. 2 is a fragmentary diagrammatic cross-sectional view along A-A line of FIG. 1A, which shows various layers (levels) that can be fabricated over the substrate 12, according to various aspects of the present disclosure. In FIG. 2, the various layers include a device layer DL and metal interconnect structures (also collectively referred to as multilayer interconnect MLI) disposed over the device layer DL. Device layer DL includes devices (e.g., transistors, resistors, capacitors, and/or inductors) and/or device components (e.g., doped wells, gate structures, and/or source/drain features). In some embodiments, device layer DL includes the substrate 12, doped regions 15 disposed in the substrate 12 (e.g., n-wells and/or p-wells), isolation features 18, and transistors T. In the depicted embodiment, transistors T include suspended nanostructures (channel layers) 26 and the gate structures 20 disposed between source/drain features 16, where the gate structures 20 wrap and/or surround the suspended nanostructures 26. The nanostructures 26 may include nanosheets, nanotubes, or nanowires, or some other type of nanostructure that extends horizontally in the X-direction. Each gate structure 20 has a metal gate structure formed from a gate electrode 22 disposed over a gate dielectric 24 and gate spacers 25 disposed along sidewalls of the metal gate structure.

Multilayer interconnect MLI electrically couples various devices and/or components of device layer DL, such that the various devices and/or components can operate as specified by design requirements for the memory. In the depicted embodiment, multilayer interconnect MLI includes a contact layer (C0 level), a via zero layer (V0 level), a metal zero (M0) level, a via one layer (V1 level), a metal one layer (M1 level), a via two layer (V2 level), a metal two layer (M2 level), a via three layer (V3 level), and a metal three layer (M3 level). The present disclosure contemplates multilayer interconnect MLI having more or less layers and/or levels, for example, a total number of N metal layers (levels) of the multilayer interconnect MLI with N as an integer ranging from 2 to 10. Each level of multilayer interconnect MLI includes conductive features (e.g., metal lines, metal vias, and/or metal contacts) disposed in one or more dielectric layers (e.g., an interlayer dielectric (ILD) layer and a contact etch stop layer (CESL)). In some embodiments, conductive features at a same level of multilayer interconnect MLI, such as M0 level, are formed simultaneously. In some embodiments, conductive features at a same level of multilayer interconnect MLI have top surfaces that are substantially planar with one another and/or bottom surfaces that are substantially planar with one another. C0 level includes source/drain contacts (MD) disposed in a dielectric layer 28; V0 level includes gate vias VG, source/drain contact vias VD, and butted contacts disposed in the dielectric layer 28; M0 level includes M0 metal lines disposed in dielectric layer 28, where gate vias VG connect gate structures to M0 metal lines, source/drain vias V0 connect source/drains to M0 metal lines, and butted contacts connect gate structures and source/drains together and to M0 metal lines; V1 level includes V1 vias disposed in the dielectric layer 28, where V1 vias connect M0 metal lines to M1 metal lines; M1 level includes M1 metal lines disposed in the dielectric layer 28; V2 level includes V2 vias disposed in the dielectric layer 28, where V2 vias connect M1 lines to M2 lines; M2 level includes M2 metal lines disposed in the dielectric layer 28; V3 level includes V3 vias disposed in the dielectric layer 28, where V3 vias connect M2 lines to M3 lines. FIG. 2 has been simplified for the sake of clarity to better understand the inventive concepts of the present disclosure. Additional features can be added in the various layers of the memory, and some of the features described can be replaced, modified, or eliminated in other embodiments of the memory. FIG. 2 is merely an example and may not reflect an actual cross-sectional view of the IC device 10 and/or the SRAM cells 100 that is discussed in further detail below.

Figure 3:
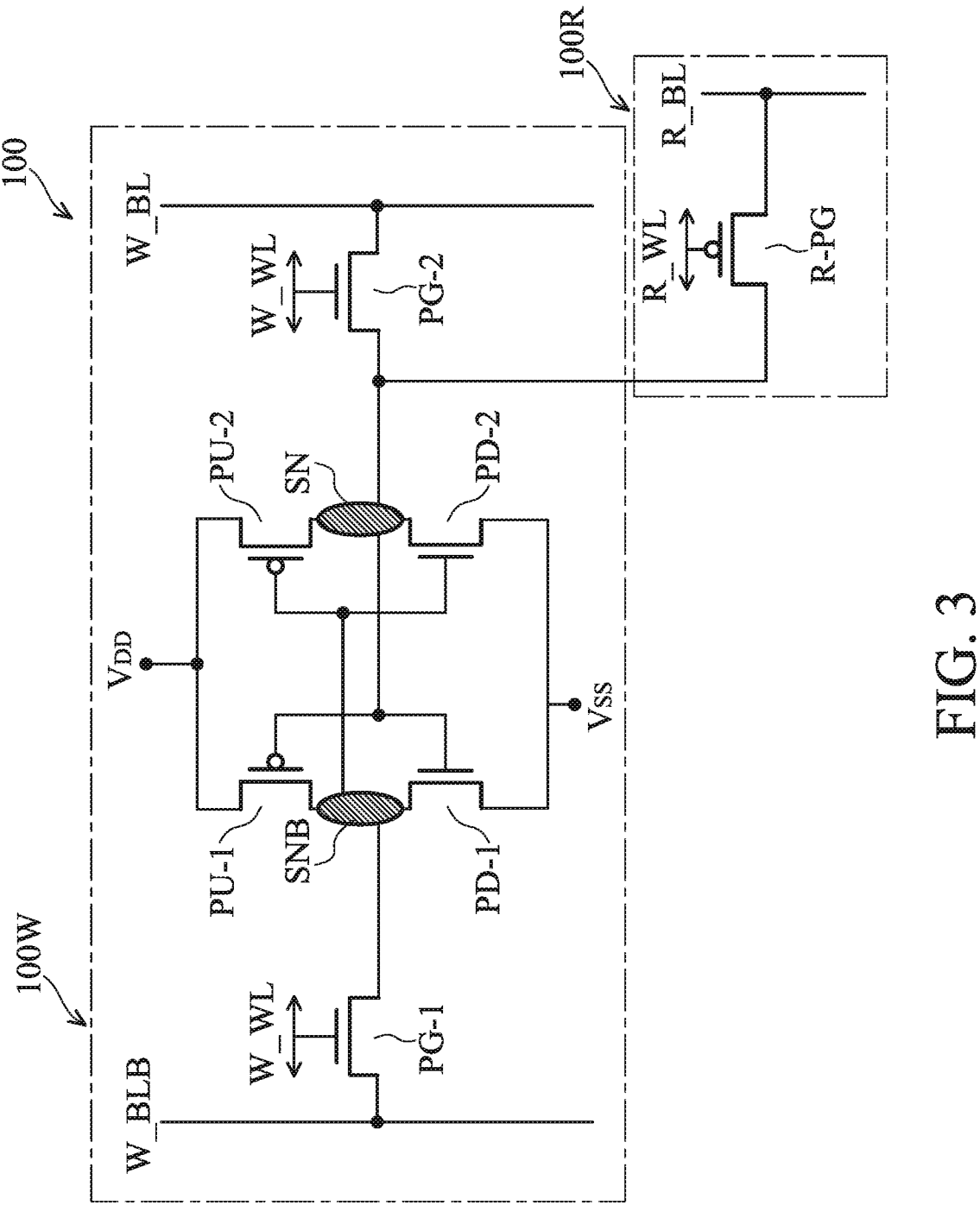
FIG. 3 illustrates a circuit schematic for a two-port static random-access memory (SRAM) cell, in accordance with some embodiments of the present disclosure.

Referring now to FIG. 3, an example circuit schematic for a two-port SRAM cell 100 is shown. The two-port SRAM cell 100 includes a write-port 100W and a read-port 100R. The write-port 100W includes pull-up transistors PU-1, PU-2, pull-down transistors PD-1, PD-2, and pass-gate transistors PG-1, PG-2. In the illustrated embodiment, transistors PU-1 and PU-2 are p-type transistors, and transistors PG-1, PG-2, PD-1, and PD-2 are n-type transistors.

The drains of the pull-up transistor PU-1 and the pull-down transistor PD-1 are coupled together, and the drains of the pull-up transistor PU-2 and the pull-down transistor PD-2 are coupled together. The transistors PU-1 and PD-1 are cross-coupled with the transistors PU-2 and PD-2 to form a data latch. The gates of the transistors PU-1 and PD-1 are coupled together and to the common drains of the transistors PU-2 and PD-2 to form a storage node SN, and the gates of the transistors PU-2 and PD-2 are coupled together and to the common drains of the transistors PU-1 and PD-1 to form a complementary storage node SNB. Sources of the pull-up transistors PU-1 and PU-2 are coupled to a power voltage Vdd (also referred to as Vcc), and the sources of the pull-down transistors PD-1 and PD-2 are coupled to a voltage Vss, which may be an electrical ground in some embodiments.

The storage node SN of the data latch is coupled to a bit line W_BL of the write-port 100W through the pass-gate transistor PG-2, and the complementary storage node SNB is coupled to a complementary bit line W_BLB of the write-port 100W through the pass-gate transistor PG-1. The storage node SN and the complementary storage node SNB are complementary nodes that are often at opposite logic levels (logic high or logic low). Gates of the pass-gate transistors PG-1 and PG-2 are coupled to a word line W_WL of the write-port 100W.

The read-port 100R of the SRAM cell 100 includes a read-port pass-gate transistor (R-PG) coupled between the bit line R_BL and the storage node SN (or to the gates of the transistors PU-1 and PD-1). The gate of the read-port pass-gate transistor R-PG is coupled to a word line R_WL of the read-port 100R. In the illustrated embodiment, the transistor R-PG is a p-type transistor. That is, in the two-port SRAM cell 100, the pass-gate transistors in a write-port are n-type transistors, and the pass-gate transistor in a read-port is a p-type transistor.

Figure 4:
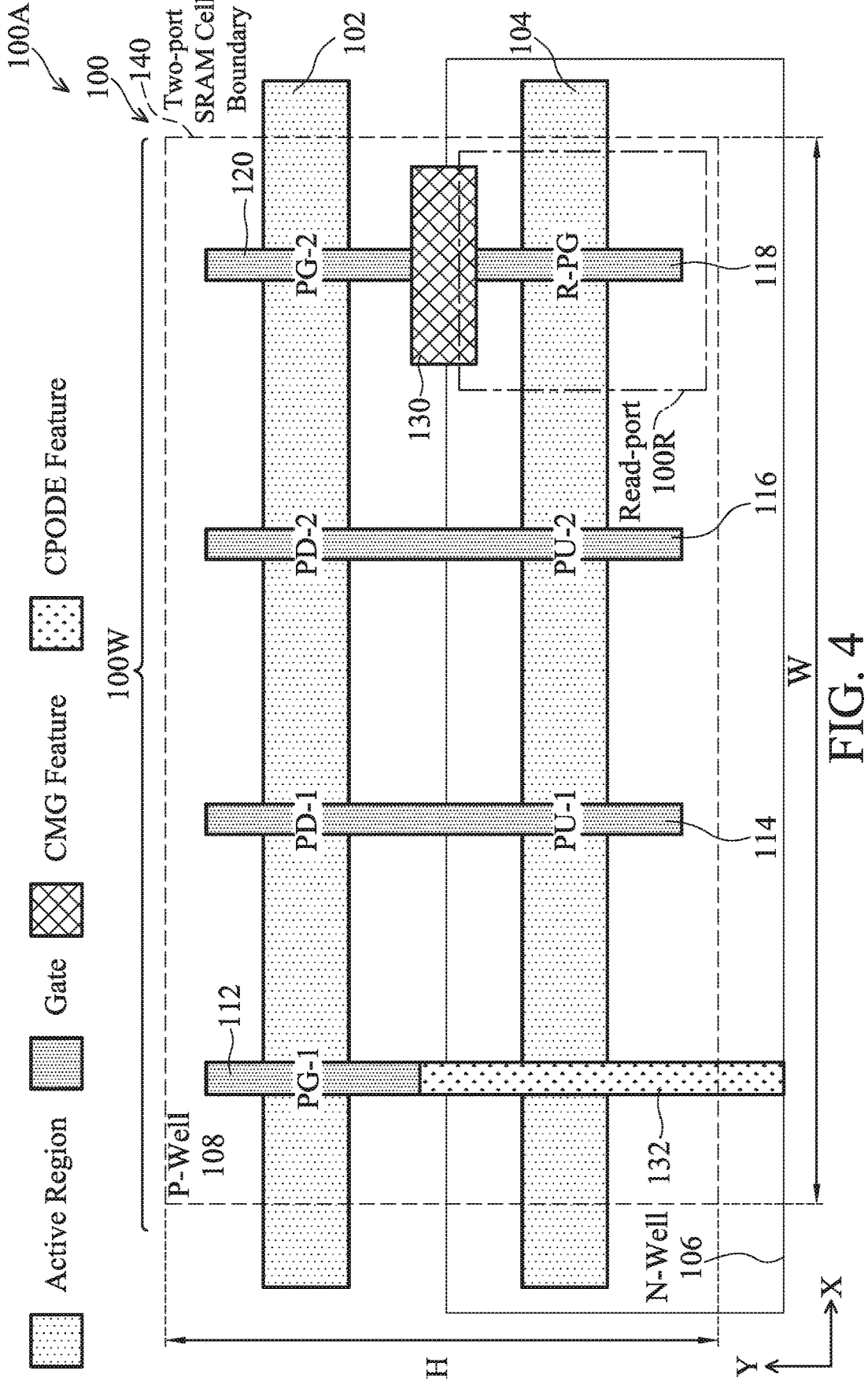
FIG. 4 illustrates a layout of a device layer of the two-port SRAM cell as in FIG. 3, in accordance with some embodiments of the present disclosure.

FIG. 4 illustrates a simplified diagrammatic layout 100A of the device layer DL of the two-port SRAM cell 100, which includes the write-port 100W and the read-port 100R. The write-port 100W includes the transistors PG-1, PG-2, PU-1, PU-2, PD-1, and PD-2. The read-port 100R includes the transistor R-PG. For reasons of visual clarity and simplicity, the layout 100A includes active regions and gate structures of those transistors in the SRAM cell 100, together with some gate-cut features, while numerous other features in or above the device layer DL such as contacts, vias, and metal lines are not included in the layout 100A.

As shown in FIG. 4, the two-port SRAM cell 100 includes active regions 102 and 104. The active regions 102, 104 each extend lengthwise in the X-direction in FIG. 4. In the illustrated embodiment, the active regions 102, 104 may each include (or may be implemented as) the nanostructures 26 of FIG. 2 discussed above. In other embodiments, the active regions 102, 104 may include fin structures as well. The active region 102 are a components of the write-port 100W, and the active region 104 has a side portion as a component of the read-port 100R and rest portion as a component of the write-port 100W. In other words, the active region 104 is shared by the read-port 100R and the write-port 100W. In the illustrated embodiment, the active region 104 belong to the transistors PU-1, PU-2, R-PG, which are PMOS devices. As such, the active region 104 is formed over an n-well 106. Meanwhile, the active region 102 belongs to the transistors PG-1, PD-1, PD-2, PG-2, which are NMOS devices. As such, the active region 202 is formed over a p-well 108 (or a p-type substrate).

As shown in FIG. 4, the two-port SRAM cell 100 further includes gate structures 112, 114, 116, 118, and 120. The gate structures 112-120 each extend lengthwise in the Y-direction in FIG. 4. The gate structures 112-120 may each include (or may be implemented as) the gate structures 20 of FIG. 2 discussed above. The gate structures 112, 114, 116, and 120 are components of the write-port 100W. The gate structure 118 is a component of the read-port 100R. The gate structures 114, 116 each extend through the two active regions 102, 104. As such, the gate structure 114 is shared by the transistors PD-1 and PU-1, and the gate structure 116 is shared by the transistors PD-2 and PU-2.

Still referring to FIG. 4, the two-port SRAM cell 100 further includes a plurality of gate-cut dielectric features, including a first dielectric feature 130 extending lengthwise along the X-direction and a second dielectric feature 132 extending lengthwise along the Y-direction. In the illustrated embodiment, the dielectric feature 130 is disposed between the active regions 102, 104 and abuts the gate structure 118 and the gate structure 120. The dielectric feature 130 divides an otherwise continuous gate structure line into two isolated segments corresponding to the gate structure 118 and the gate structure 120. The dielectric feature 130 is formed by filling a corresponding cut-metal-gate (CMG) trench in the position of the dielectric feature 130. The dielectric feature 130 is also referred to as a CMG feature. In the illustrated embodiment, the dielectric feature 130 is disposed above an interface between the n-well 106 and the p-well 108.

A CMG process refers to a fabrication process where after a metal gate (e.g., a high-k metal gate or HKMG) replaces a dummy gate structure (e.g., a polysilicon gate), the metal gate is cut (e.g., by an etching process) to separate the metal gate into two or more gate segments. Each gate segment functions as a metal gate for an individual transistor. An isolation material is subsequently filled into trenches between adjacent portions of the metal gate. These trenches are referred to as cut-metal-gate trenches, or CMG trenches, in the present disclosure. The dielectric material filling a CMG trench for isolation is referred to as a CMG feature. To ensure a metal gate would be completely cut, a CMG feature often further extends into adjacent areas, such as dielectric layers filling space between the metal gates. A CMG feature often have an elongated shape in a top view.

The gate-cut feature 132 is formed in a continuous-poly-on-diffusion-edge (CPODE) process and also referred to as a CPODE feature. For purposes of this disclosure, a "diffusion edge" may be equivalently referred to as an active edge, where for example an active edge abuts adjacent active regions. Before the CPODE process, the active edge may include a dummy GAA structure having a dummy gate structure (e.g., a polysilicon gate) and a plurality of vertically stacked nanostructures as channel layers. In addition, inner spacers may be disposed between adjacent nanostructures at lateral ends of the nanostructures. In various examples, source/drain epitaxial features are disposed on either side of the dummy GAA structure, such that the adjacent source/drain epitaxial features are in contact with the inner spacers and nanostructures of the dummy GAA structure. The subsequent CPODE etching process removes the dummy gate structure and the channel layers from the dummy GAA structure to form a CPODE trench. The dielectric material filling a CPODE trench for isolation is referred to as a CPODE feature. In some embodiments, after the CPODE features are formed, the remaining dummy gate structures are replaced by metal gate structures in a replacement gate (gate-last) process. State differently, in some embodiments, the CPODE feature replaces a portion of the otherwise continuous gate structure and is confined between the opposing gate spacers of the replaced portion of the gate structure. As a comparison, the CMG feature is formed after the formation of the metal gate structure line and truncates the otherwise continuous gate structure line and extends into adjacent areas of the gate structure, while the CPODE feature is formed after the formation of the polysilicon gate structure line and prior to the formation of the metal gate structure and extends aligned with the metal gate structure. In FIG. 4, the CPODE feature 132 abuts the gate structure 112 and is aligned with the gate structure 112. The CPODE feature 132 extends along the Y-direction and across the n-well 106 into another p-well 108 of an adjacent SRAM cell. That is, two adjacent SRAM cells may share the CPODE feature 132. Further, the CPODE feature 132 may extend downwardly deeper into the underneath substrate than the CMG feature 130, in some embodiments.

Still referring to FIG. 4, a boundary 140 of the two-port SRAM cell 100 is illustrated in FIG. 4 using broken lines. Note that some of the active regions and gate structures may extend beyond the illustrated boundary 140, since these active regions and gate structures may also form components of other adjacently located SRAM cells as well. The boundary 140 is longer in the X-direction than in the Y-direction. In other words, the boundary 140 may be rectangular. The first dimension of the boundary 140 along the X-direction is denoted as a cell width W, and the second dimension of the boundary 140 along the Y-direction is denoted as a cell height H. Where the two-port SRAM cell 100 is repeated in a memory array, the cell width W may represent and be referred to as a memory cell pitch in the memory array along the X-direction, and the cell height H may represent and be referred to as a memory cell pitch in the memory array along the Y-direction.

The cell size of the two-port SRAM cell 100 is W×H, in which the cell width W is about 4 times a poly pitch (e.g., a center-to-center distance between two adjacent gate structures along the X-direction) and the cell heigh H is about 2 times an isolation pitch (e.g., a center-to-center distance between two adjacent STI features along the Y-direction). Denoting an area of one poly pitch times one isolation pitch as a unit area, each unit area includes an intersection of a gate structure and an active region, and the two-port SRAM cell 100 utilizes a cell size of about 8 times a unit area in accommodating the seven transistors, namely the transistors PG-1, PG-2, PU-1, PU-2, PD-1, PD-2, and R-PG. The area utilization at the device layer of the SRAM cell 100 is considered efficient as there is only one unit area not utilized for forming a functional transistor but hosting an intersection of a CPODE feature and an active region instead.

Figure 5:
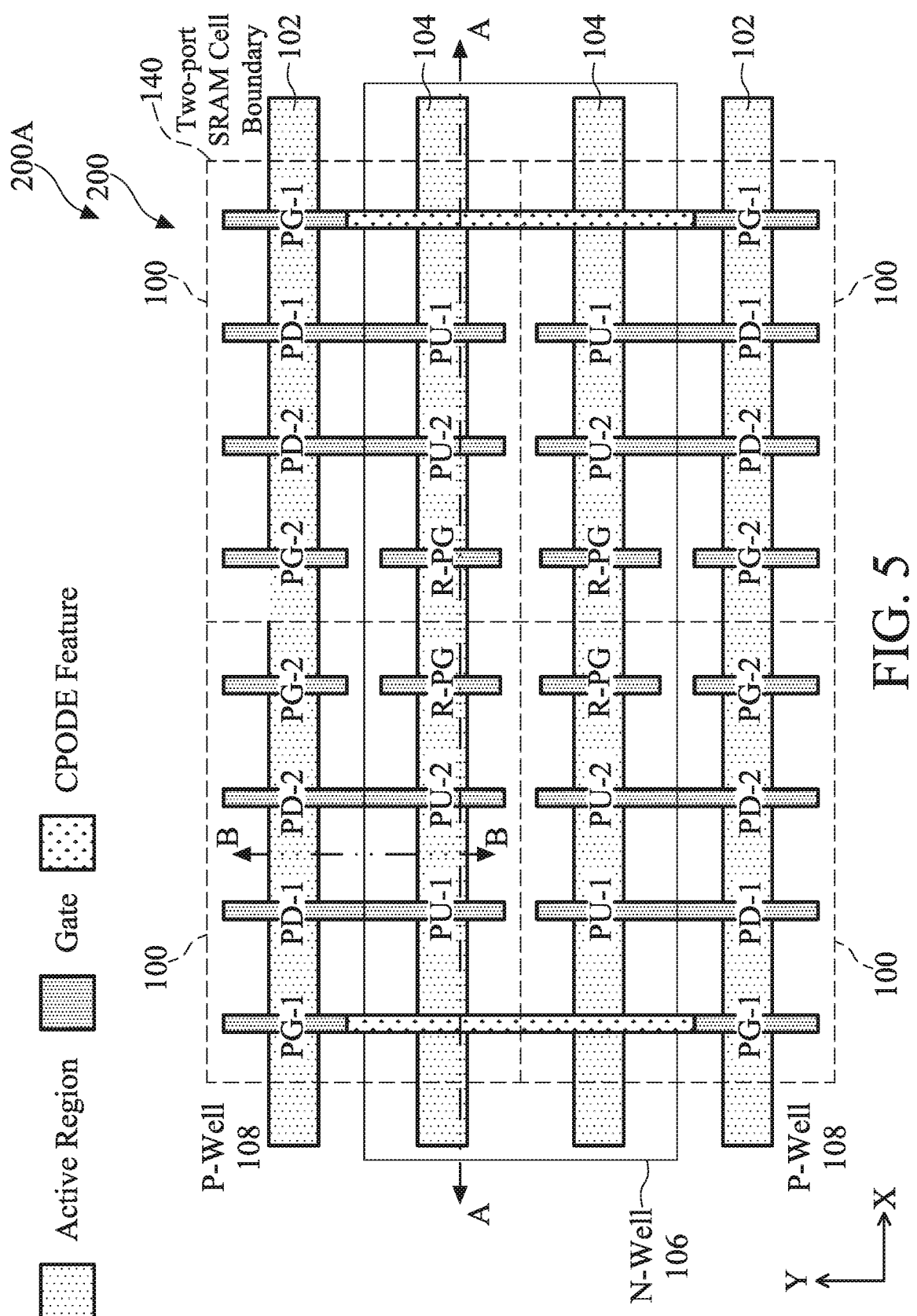
FIGS. 5 and 6 illustrate layouts of an SRAM array based on the two-port SRAM cell as in FIG. 4, in accordance with some other embodiments of the present disclosure.

FIG. 5 illustrates a simplified diagrammatic layout 200A of an SRAM array 200 according to the present disclosure. For reasons of visual clarity and simplicity, the layout 200A includes active regions and gate structures of those transistors in the SRAM array, together with well regions and CPODE features, while numerous other features such as CMG features, contacts, vias, and metal lines are not included in the layout 200A.

Referring to FIG. 5, a plurality of two-port SRAM cells 100 are arranged in the X-direction and the Y-direction, forming a 2×2 array of SRAM cells. Each SRAM cell in the array may use the layout 100A of the SRAM cell 100 as depicted in FIG. 4. In some embodiments, two adjacent SRAM cells in the X-direction are line symmetric with respect to a common boundary therebetween, and two adjacent SRAM cells in the Y-direction are line symmetric with respect to a common boundary therebetween. That is, a first SRAM cell 100 is a duplicate cell for a second SRAM cell 100 but flipped over the Y-axis; a third SRAM cell 100 is a duplicate cell for the first SRAM cell 100 but flipped over the X-axis; and a fourth SRAM cell 100 is a duplicate cell for the second SRAM cell 100 but flipped over the X-axis.

The SRAM array 200 includes well regions 106 and 108 alternately arranged along the Y-axis. In other words, every p-well region 108 is next to an n-well region 106 which is next to another p-well region 108, and this pattern repeats. In the illustrated embodiment as in FIG. 5, the gate structures in each two-port SRAM cell do not extend beyond the respective cell boundary, and each CPODE feature is shared by two neighboring SRAM cells arranged in the Y-direction. The distance along the X-direction between adjacent CPODE features (also denoted as CPODE-to-CPODE pitch) is 7 times a poly pitch.

Figure 6:
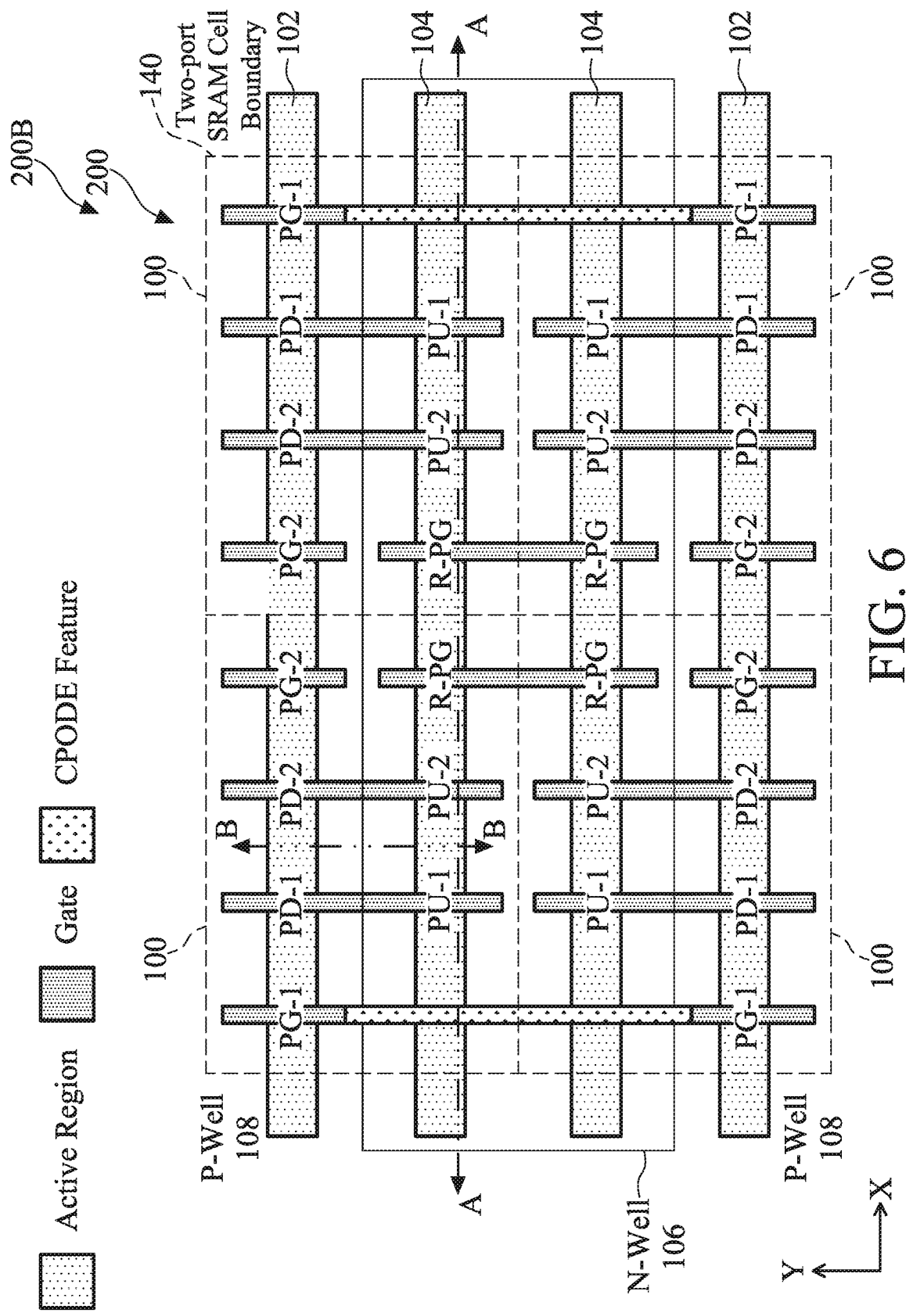

FIG. 6 illustrates a simplified diagrammatic layout 200B of the SRAM array 200 according to the present disclosure. In the alternative layout 200B, some gate structures may be shared by neighboring SRAM cells, such that these gate structures extend lengthwise across the boundary between neighboring SRAM cells. Referring to FIG. 6, the two transistors R-PG in the two adjacent SRAM cells 100 in the same column (arranged along the Y-direction) may share the same gate structure, such that the shared gate structure may extend lengthwise across the boundary between the two adjacent SRAM cells 100.

FIG. 7A is a fragmentary diagrammatic cross-sectional view along A-A line of FIG. 5 (or FIG. 6), which cuts the active region 104 along its lengthwise direction, according to various aspects of the present disclosure. FIG. 7B is a fragmentary diagrammatic cross-sectional view along B-B line of FIG. 5 (or FIG. 6), which cuts source/drain regions along a middle line of an SRAM cell 100, according to various aspects of the present disclosure. Referring to FIGS. 7A and 7B collectively, the active region 104 extends through two SRAM cells 100 along the X-direction but sandwiched by two CPODE features. The CPODE features replace the otherwise metal gate structures closest to the cell edges. The distance between the CPODE features (CPODE-to-CPODE pitch) is 7 times a poly pitch. Between the CPODE features, the active region 104 includes channel regions that is comprised of the nanostructures 26 and source/drain features 16 abut the ends of the nanostructures 26. The gate structures wrap around the nanostructures 26 and form the transistors PU-1, PU-2, R-PG in the respective SRAM cell 100. The active region 104 is disposed over the n-well 106, and the active region 102 is disposed over the p-well 108. The source/drain features 16 formed on the active region 104 is p-type epitaxial features, and the source/drain features 16 formed on the active region 102 is n-type epitaxial features. The source/drain contact MD electrically connects to the source/drain features 16 formed on the active regions 102 and 104.

Figure 8:
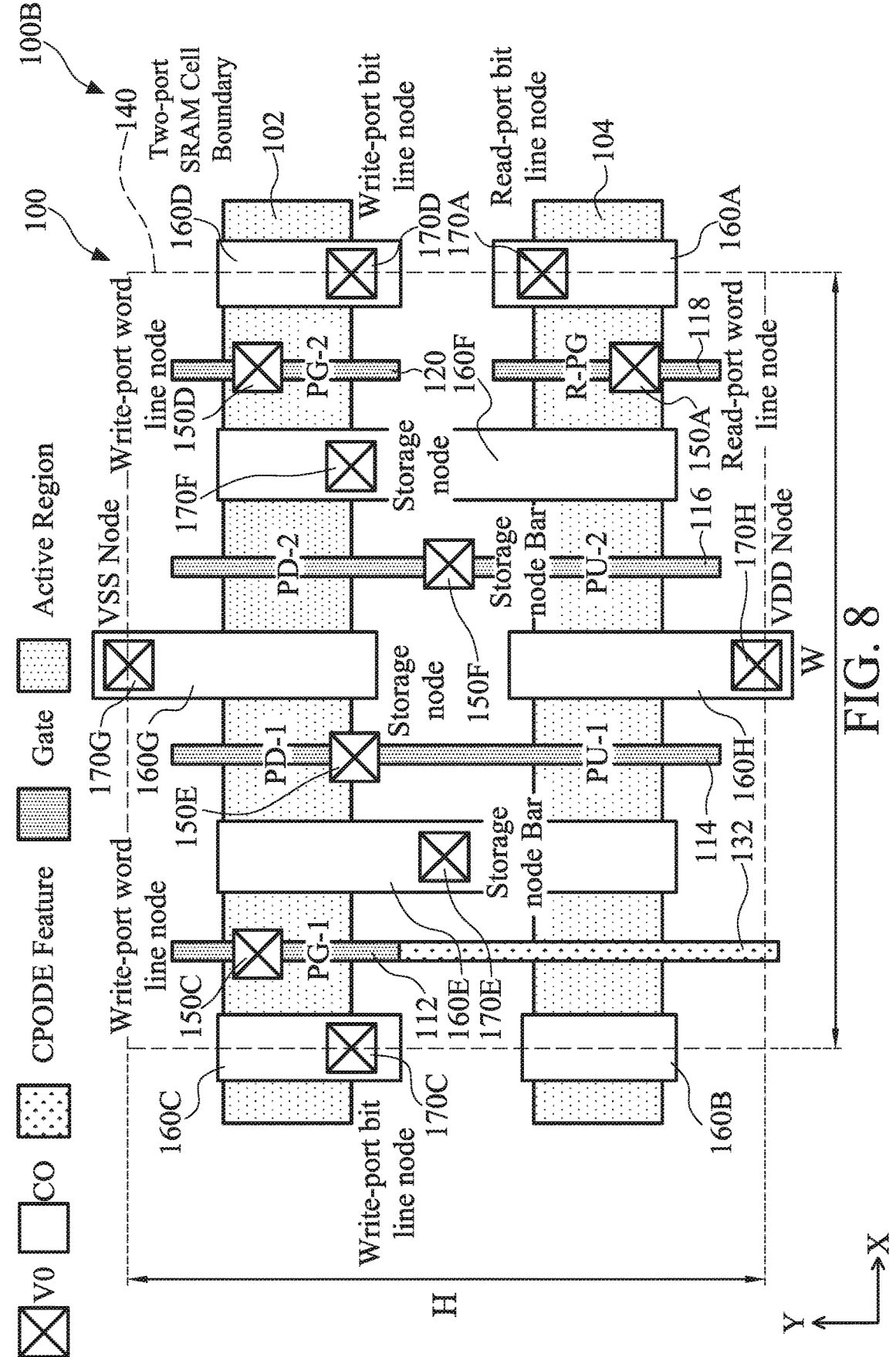
FIGS. 8, 9, 10, and 11 illustrate a first layout of metal interconnect structures of the two-port SRAM cell as in FIG. 3 at various contact and metal layers, in accordance with some embodiments of the present disclosure.
Figure 9:
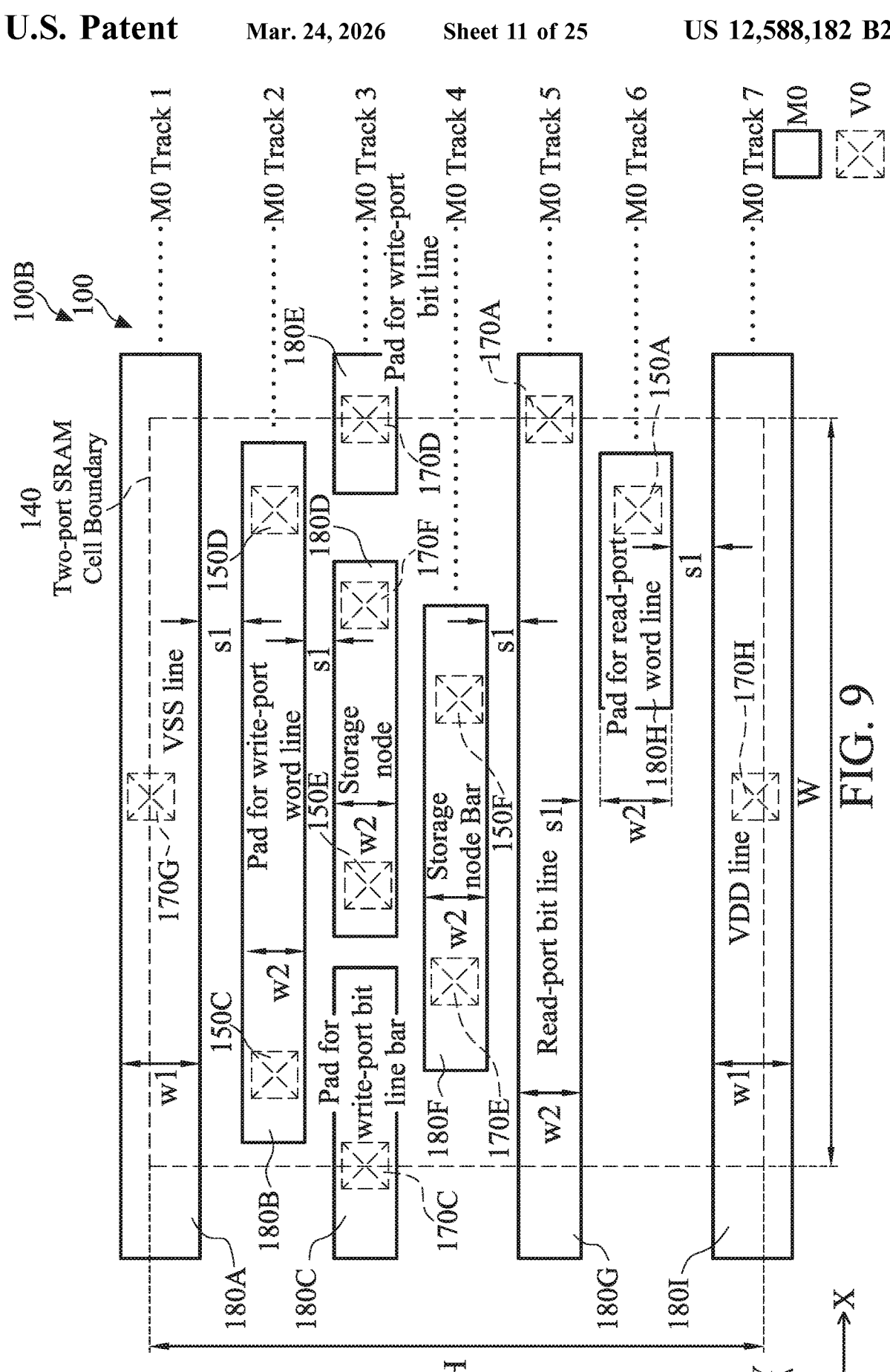
Figure 10:
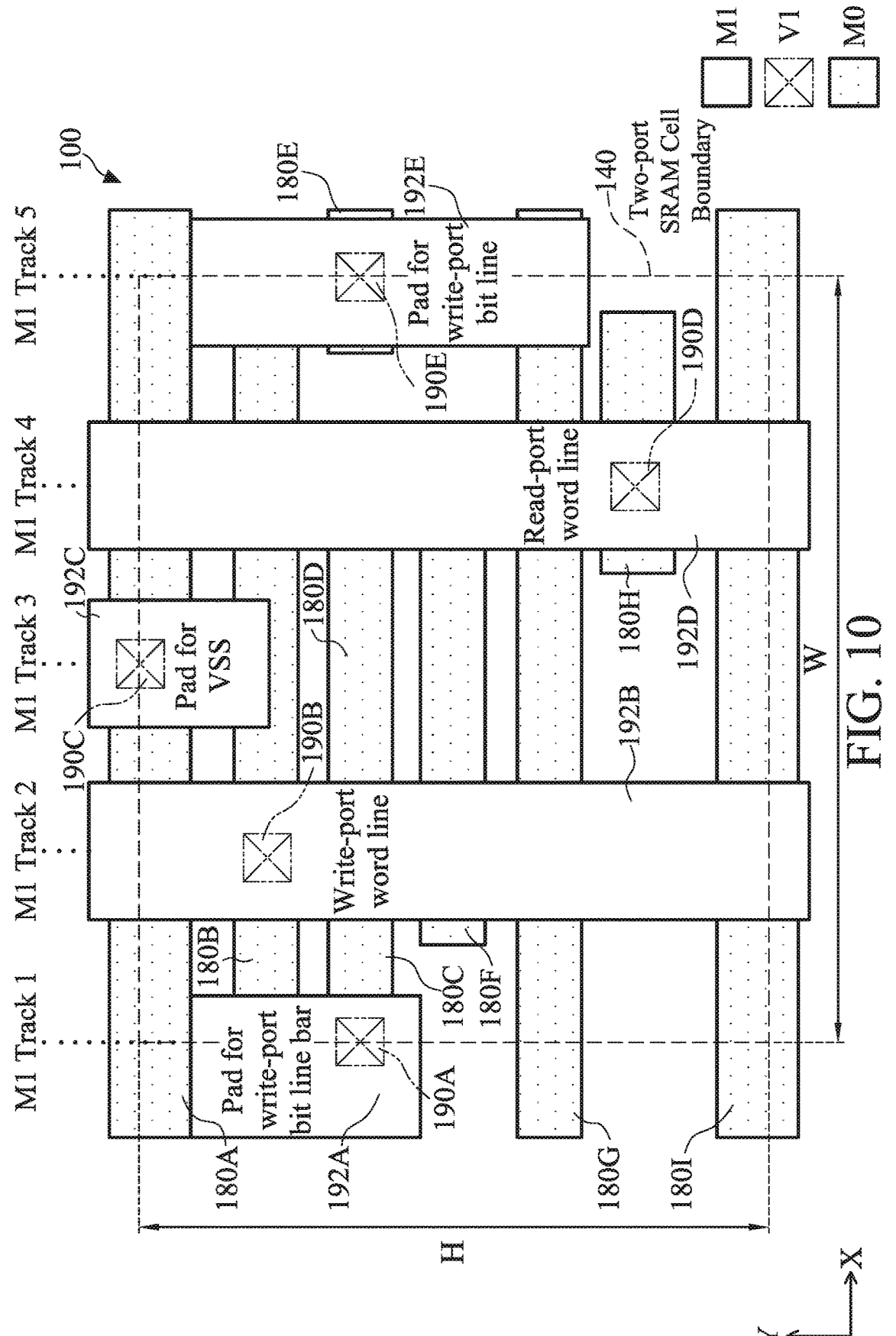
Figure 11:
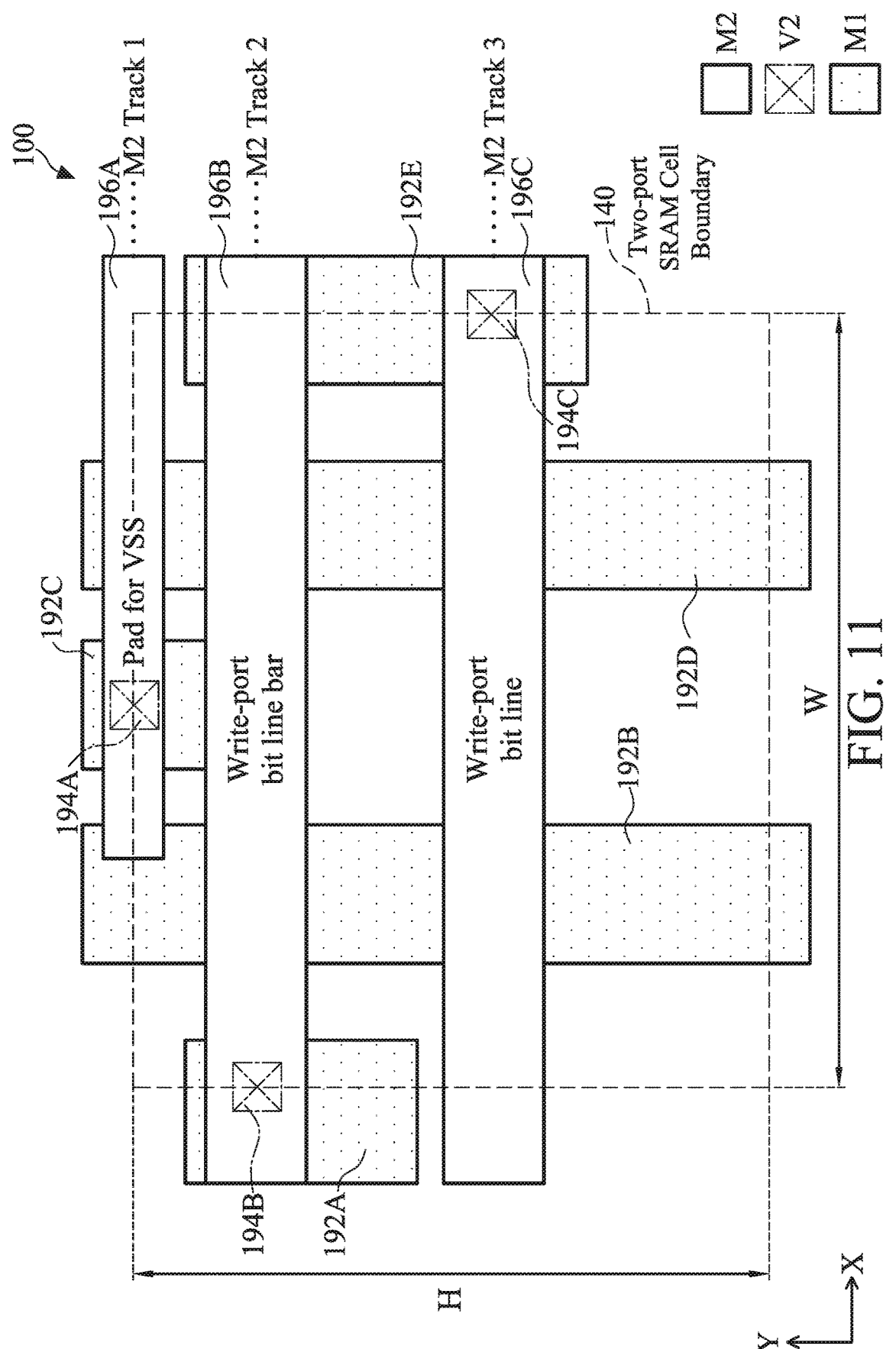

FIGS. 8, 9, 10, and 11 illustrate a simplified diagrammatic layout 100B at different layers of the metal interconnect structures of the two-port SRAM cell 100. Particularly, FIG. 8 illustrates the conductive features in the contact level (C0) and the via zero (V0) level, FIG. 9 illustrates the via zero (V0) level and the metal zero (M0) level, FIG. 10 illustrates the via one (V1) level and metal one (M1) level, and FIG. 11 illustrates the via two (V2) level and metal two (M2) level.

FIG. 8 depicts the conductive features in the contact level (C0) and the via zero (V0) level. Also, for reasons of aiding visual clarity, some features in the layout 100A devoted to the device layer DL are reproduced in FIG. 8, such as the active regions 102, 104, the gate structures 112-120, the CPODE feature 132, and the cell boundary 140, while numerous other features are omitted in FIG. 8.

A gate contact 150A electrically connects a gate of the read-port pass-gate transistor R-PG (formed by the gate structure 118) to the read-port word line node (R_WL). A gate contact 150C electrically connects a gate of the write-port pass-gate transistor PG-1 (formed by the gate structure 112) to the write-port word line node (W_WL). A gate contact 150D electrically connects a gate of the write-port pass-gate transistor PG-2 (formed by the gate structure 120) to the write-port word line node (W_WL). A gate contact 150E electrically connects a gate of the write-port pull-down transistor PD-1 (formed by the gate structure 114) and a gate of the write-port pull-up transistor PU-1 (also formed by the gate structure 114) to the storage node (SN). A gate contact 150F electrically connects a gate of the write-port pull-down transistor PD-2 (formed by the gate structure 116) and a gate of the write-port pull-up transistor PU-2 (also formed by the gate structure 116) to the complementary storage node (SNB).

A source/drain contact 160A and a source/drain contact via 170A landing thereon electrically connect a source region of the read-port pass-gate transistor R-PG to the read-port bit line node (R_BL). A source/drain contact 160B lands on a source/drain region adjacent to the CPODE feature 132 and stays electrically floating, as there is no corresponding source/drain contact via landing thereon. A source/drain contact 160C and a source/drain contact via 170C landing thereon electrically connect a source region of the write-port pass-gate transistor PG-1 to the write-port complementary bit line node (W_BLB). A source/drain contact 160D and a source/drain contact via 170D landing thereon electrically connect a source region of the write-port pass-gate transistor PG-2 to the write-port bit line node (W_BL). A source/drain contact 160E and a source/drain contact via 170E landing thereon electrically connect a common drain region of the write-port pass-gate transistor PG-1 and the write-port pull-down transistor PD-1 together with a drain region of the write-port pull-up transistor PU-1 to the complementary storage node (SNB). A source/drain contact 160F and a source/drain contact via 170F landing thereon electrically connect a common drain region of the write-port pass-gate transistor PG-2 and the write-port pull-down transistor PD-2 together with a common drain region of the write-port pull-up transistor PU-2 and the read-port pass-gate transistor R-PG to the storage node (SN). A source/drain contact 160G and a source/drain contact via 170G landing thereon electrically connect a common source region of the write-port pull-down transistor PD-1 and the write-port pull-down transistor PD-2 to the electrical ground node Vss. A source/drain contact 160H and a source/drain contact via 170H landing thereon electrically connect a common source region of the write-port pull-up transistor PU-1 and the write-port pull-up transistor PU-2 to the power voltage node VDD. In the illustrated embodiment, the source/drain contacts 160A-160H each are elongated and have a longitudinal direction in the Y-direction, which is parallel to the extending directions of gate structures.

As shown in FIG. 8, the storage node SN includes the gate contact 150E and the source/drain contact via 170F positioned on two opposing sides of the gate structure 116. As to discuss in further detail below, a metal line at the M0 level extends in the X-direction to across the gate structure 116 and connects the gate contact 150E and the source/drain contact via 170F. In other words, an M0 metal line hangs over the gate structure 116 and provide the function of cross coupling between the gate contact 150E and the source/drain contact via 170F. Therefore, in the layout 100B, the gate contact 150E and the source/drain contact via 170F are positioned as being level in the Y-direction, such that a metal line extending in the X-direction may connect both. Similarly, the complementary storage node (storage node bar) SNB includes the gate contact 150F and the source/drain contact via 170E positioned on two opposing sides of the gate structure 114. As to discuss in further detail below, another metal line at the M0 level extends in the X-direction to across the gate structure 114 and connects the gate contact 150F and the source/drain contact via 170E. In other words, another M0 metal line hangs over the gate structure 114 and provide the function of cross coupling between the gate contact 150F and the source/drain contact via 170E. Therefore, in the layout 100B, the gate contact 150F and the source/drain contact via 170E are positioned as being level in the Y-direction, such that a metal line extending in the X-direction may connect both.

FIG. 9 illustrates the via zero (V0) level and metal zero (M0) level of the layout 100B of the metal interconnect structures of the two-port SRAM cell 100. At the M0 level, the SRAM cell 100 includes a plurality of metal tracks arranged in parallel. Particularly, in the illustrated embodiment of the layout 100B, the SRAM cell 100 includes seven metal tracks arranged in order from first (M0 Track 1) to seventh (M0 Track 7) along the Y-direction. The center lines of the metal tracks are represented by the dotted lines in FIG. 9. A distance between the center lines of the adjacent metal tracks is denoted as the metal track pitch.

One metal track may include a single metal line extending through the entire SRAM cell 100 along the X-direction. Such a metal line is denoted as a global metal line. Alternatively, one metal track may include one or more metal lines that do not extend through the entire SRAM cell 100. Such a metal line is denoted as a local metal line, or referred to as an island, a pad, or a landing pad. In the layout 100B, the first metal track "M0 Track 1" includes a global metal line 180A, which is a Vss line electrically coupled to the source/drain contact via 170G. The Vss line 180A is disposed on an upper edge of the SRAM cell 100 and may be shared with an adjacent SRAM cell. The second metal track "M0 Track 2" includes a local metal line 180B as a pad for the write-port word line (W_WL). The local metal line 180B is fully within the SRAM cell 100 and electrically connects to the gate contact 150C and the gate contact 150D. The third metal track "M0 Track 3" includes three local metal lines 180C, 180D, and 180E. The local metal line 180C provides a pad for the write-port complimentary bit line (W_BLB). The local metal line 180C extends beyond a left edge of the SRAM cell 100 and may be shared with an adjacent SRAM cell. The local metal line 180D is fully within the SRAM cell 100, which belongs to the storage node (SN) and provides cross-coupling between the gate contact 150E and the source/drain contact via 170F. As discussed above, the local metal line 180D crosses over the gate structure 116. The local metal line 180E provides a pad for the write-port bit line (W_BL). The local metal line 180E extends beyond a right edge of the SRAM cell 100 and may be shared with an adjacent SRAM cell. The fourth metal track "M0 Track 4" includes a local metal line 180F, which belongs to the complementary storage node (SNB). The local metal line 180F is fully within the SRAM cell 100 and provides cross-coupling between the gate contact 150F and the source/drain contact via 170E. As discussed above, the local metal line 180F crosses over the gate structure 114. The fifth metal track "M0 Track 5" includes a global metal line 180G, which is a read-port bit line electrically coupled to the source/drain contact via 170A. The sixth metal track "M0 Track 6" includes a local metal line 180H. The local metal line 180H is fully within the SRAM cell 100 and provides a pad for the read-port word line (R_WL). The seventh metal track "M0 Track 7" includes a global metal line 180I, which is a VDD line electrically coupled to the source/drain contact via 170H. The VDD line 180I is disposed on a lower edge of the SRAM cell 100 and may be shared with an adjacent SRAM cell.

A width of the VSS line 180A is denoted as w1 with one half of w1 in one SRAM cell and another half of w1 in the adjacent SRAM cell. A width of the VDD line 180I may be substantially the same as the VSS line 180A with one half of w1 in one SRAM cell and another half of w1 in the adjacent SRAM cell. The other M0 metal lines 180B-180H may each have the same width denoted as w2. The spacing between two adjacent M0 metal lines may be uniform and denoted as s1. Thus, the SRAM cell height H equals w1+5*w2+6*s1.

FIG. 10 illustrates the via one (V1) level and metal one (M1) level of the layout 100B of the metal interconnect structures of the two-port SRAM cell 100. Also, for reasons of aiding visual clarity, M0 metal lines 180A-180I depicted in FIG. 9 are reproduced in FIG. 10. At the M1 level, the SRAM cell 100 includes a plurality of metal tracks arranged in parallel. Particularly, in the illustrated embodiment of the layout 100B, the SRAM cell 100 includes five metal tracks arranged in order from first (M1 Track 1) to fifth (M1 Track 5) along the X-direction. The center lines of the metal tracks are represented by the dotted lines in FIG. 10.

In the layout 100B, the first metal track "M1 Track 1" includes a local metal line 192A, which provides a pad for the write-port complimentary bit line (W_BLB) and electrically couples to the underneath M0 metal line 180C through the V1 via 190A. The second metal track "M1 Track 2" includes a global metal line 192B, which is the write-port word line (W_WL) and electrically couples to the underneath M0 metal line 180B (pad for W_WL) through V1 via 190B. The third metal track "M1 Track 3" includes a local metal line 192C, which provides a pad for the VSS line and electrically couples to the underneath M0 metal line 180A (VSS line) through V1 via 190C. The fourth metal track "M1 Track 4" includes a global metal line 192D, which is the read-port word line (R_WL) and electrically couples to the underneath M0 metal line 180H (pad for R_WL) through V1 via 190D. The fifth metal track "M1 Track 5" includes a local metal line 192E, which provides a pad for the write-port bit line (W_BL) and electrically couples to the underneath M0 metal line 180E (pad for W_BL) through V1 via 190E.

FIG. 11 illustrates the via two (V2) level and metal two (M2) level of the layout 100B of the metal interconnect structures of the two-port SRAM cell 100. Also, for reasons of aiding visual clarity, M1 metal lines 192A-192E depicted in FIG. 10 are reproduced in FIG. 10. At the M2 level, the SRAM cell 100 includes a plurality of metal tracks arranged in parallel. Particularly, in the illustrated embodiment of the layout 100B, the SRAM cell 100 includes three metal tracks arranged in order from first (M2 Track 1) to third (M2 Track 3) along the Y-direction. The center lines of the metal tracks are represented by the dotted lines in FIG. 11.

In the layout 100B, the first metal track "M2 Track 1" includes a local metal line 196A, which provides a pad for the VSS line and electrically couples to the underneath M1 metal line 192C (pad for VSS) through V2 via 194A. The second metal track "M2 Track 2" includes a global metal line 196B, which is the write-port complimentary bit line (W_BLB) and electrically couples to the underneath M1 metal line 192A (pad for W_BLB) through V2 via 194B. The third metal track "M3 Track 3" includes a global metal line 196C, which is the write-port bit line (W_BL) and electrically couples to the underneath M1 metal line 192E through V2 via 194C. In the illustrated embodiment, the M2 metal lines 196B and 196C have larger width than the M2 metal line 196A.

Figure 12:
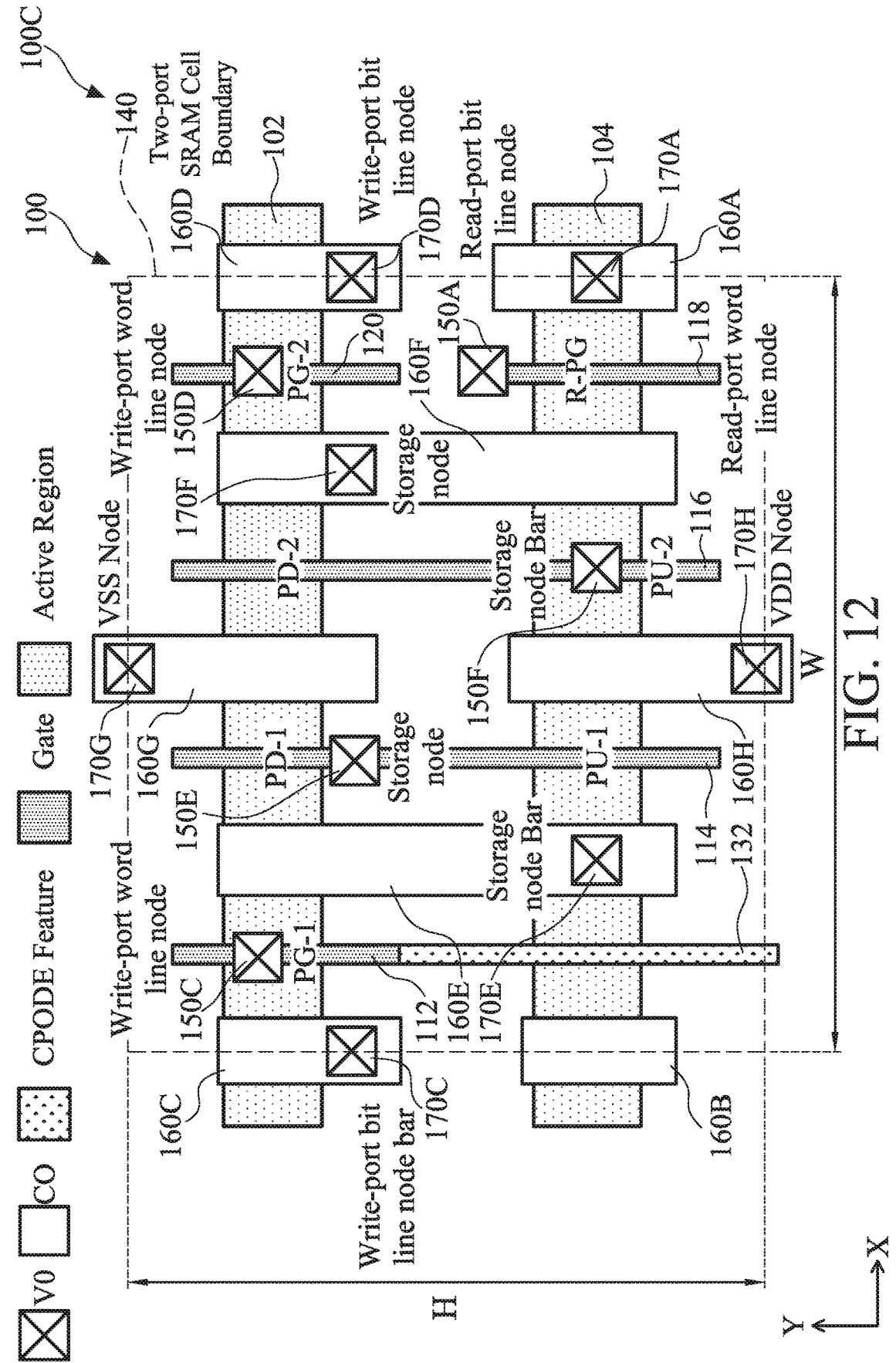
FIGS. 12, 13, 14, and 15 illustrate a second layout of metal interconnect structures of the two-port SRAM cell as in FIG. 3 at various contact and metal layers, in accordance with some embodiments of the present disclosure.
Figure 13:
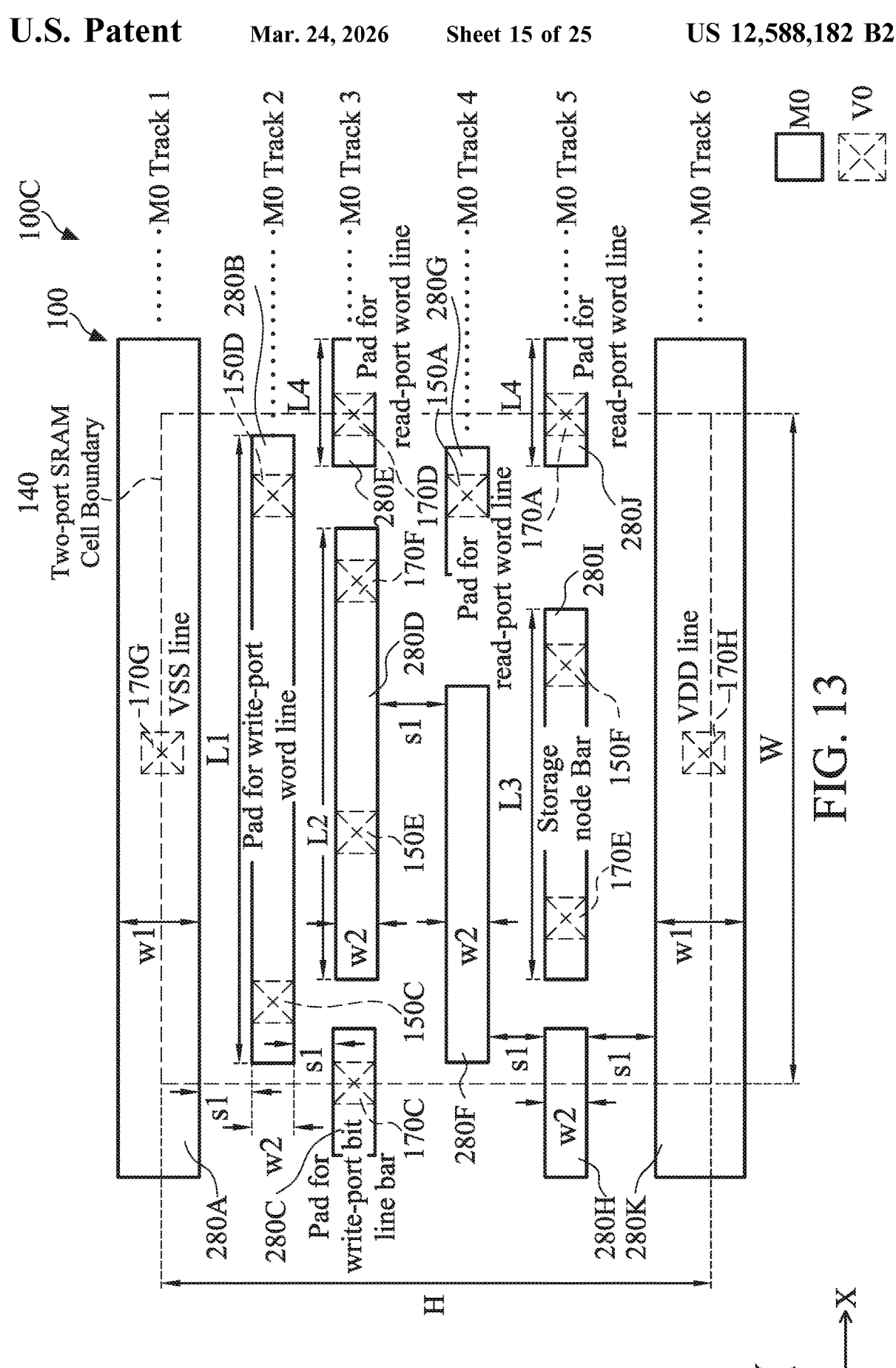
Figure 14:
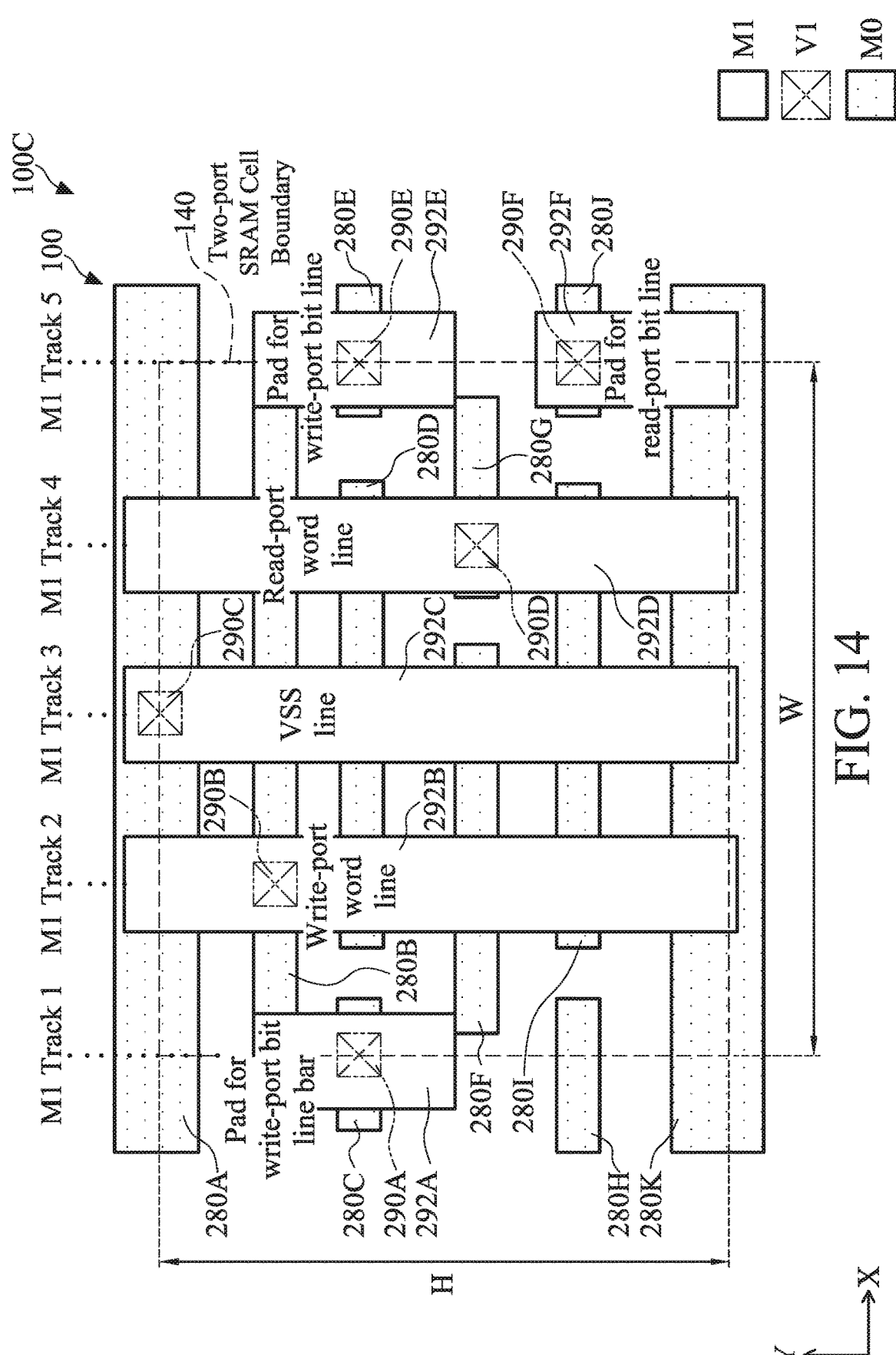
Figure 15:
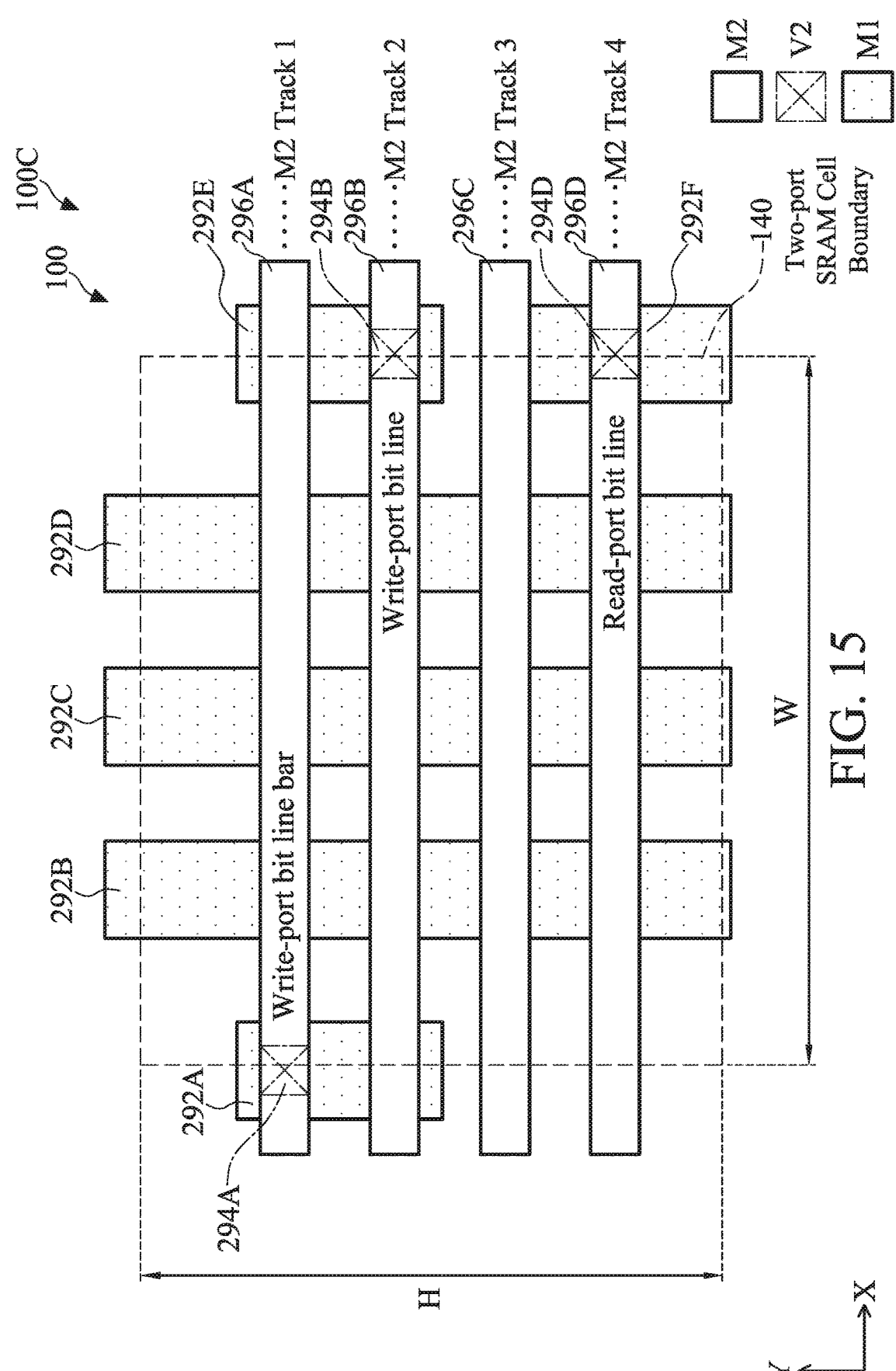

As an alternative embodiment of the metal interconnect structures, FIGS. 12, 13, 14, and 15 illustrate a simplified diagrammatic layout 100C at different layers of the metal interconnect structures of the two-port SRAM cell 100. Particularly, FIG. 12 illustrates the conductive features in the contact level (C0) and the via zero (V0) level, FIG. 13 illustrates the via zero (V0) level and the metal zero (M0) level, FIG. 14 illustrates the via one (V1) level and metal one (M1) level, and FIG. 15 illustrates the via two (V2) level and metal two (M2) level.

FIG. 12 depicts the conductive features in the contact level (C0) and the via zero (V0) level. Also, for reasons of aiding visual clarity, some features in the layout 100A devoted to the device layer DL are reproduced in FIG. 12, such as the active regions 102, 104, the gate structures 112-120, the CPODE feature 132, and the cell boundary 140, while numerous other features are omitted in FIG. 12.

A gate contact 150A electrically connects a gate of the read-port pass-gate transistor R-PG (formed by the gate structure 118) to the read-port word line node (R_WL). A gate contact 150C electrically connects a gate of the write-port pass-gate transistor PG-1 (formed by the gate structure 112) to the write-port word line node (W_WL). A gate contact 150D electrically connects a gate of the write-port pass-gate transistor PG-2 (formed by the gate structure 120) to the write-port word line node (W_WL). A gate contact 150E electrically connects a gate of the write-port pull-down transistor PD-1 (formed by the gate structure 114) and a gate of the write-port pull-up transistor PU-1 (also formed by the gate structure 114) to the storage node (SN). A gate contact 150F electrically connects a gate of the write-port pull-down transistor PD-2 (formed by the gate structure 116) and a gate of the write-port pull-up transistor PU-2 (also formed by the gate structure 116) to the complementary storage node (SNB).

A source/drain contact 160A and a source/drain contact via 170A landing thereon electrically connect a source region of the read-port pass-gate transistor R-PG to the read-port bit line node (R_BL). A source/drain contact 160B lands on a source/drain region adjacent to the CPODE feature 132 and stays electrically floating, as there is no corresponding source/drain contact via landing thereon. A source/drain contact 160C and a source/drain contact via 170C landing thereon electrically connect a source region of the write-port pass-gate transistor PG-1 to the write-port complementary bit line node (W_BLB). A source/drain contact 160D and a source/drain contact via 170D landing thereon electrically connect a source region of the write-port pass-gate transistor PG-2 to the write-port bit line node (W_BL). A source/drain contact 160E and a source/drain contact via 170E landing thereon electrically connect a common drain region of the write-port pass-gate transistor PG-1 and the write-port pull-down transistor PD-1 together with a drain region of the write-port pull-up transistor PU-1 to the complementary storage node (SNB). A source/drain contact 160F and a source/drain contact via 170F landing thereon electrically connect a common drain region of the write-port pass-gate transistor PG-2 and the write-port pull-down transistor PD-2 together with a common drain region of the write-port pull-up transistor PU-2 and the read-port pass-gate transistor R-PG to the storage node (SN). A source/drain contact 160G and a source/drain contact via 170G landing thereon electrically connect a common source region of the write-port pull-down transistor PD-1 and the write-port pull-down transistor PD-2 to the electrical ground node Vss. A source/drain contact 160H and a source/drain contact via 170H landing thereon electrically connect a common source region of the write-port pull-up transistor PU-1 and the write-port pull-up transistor PU-2 to the power voltage node VDD. In the illustrated embodiment, the source/drain contacts 160A-160H each are elongated and have a longitudinal direction in the Y-direction, which is parallel to the extending directions of gate structures.

As shown in FIG. 12, the storage node SN includes the gate contact 150E and the source/drain contact via 170F positioned on two opposing sides of the gate structure 116. As to discuss in further detail below, a metal line at the M0 level extends in the X-direction to across the gate structure 116 and connects the gate contact 150E and the source/drain contact via 170F. In other words, an M0 metal line hangs over the gate structure 116 and provide the function of cross coupling between the gate contact 150E and the source/drain contact via 170F. Therefore, in the layout 100C, the gate contact 150E and the source/drain contact via 170F are positioned as being level in the Y-direction, such that a metal line extending in the X-direction may connect both. Similarly, the complementary storage node (storage node bar) SNB includes the gate contact 150F and the source/drain contact via 170E positioned on two opposing sides of the gate structure 114. As to discuss in further detail below, another metal line at the M0 level extends in the X-direction to across the gate structure 114 and connects the gate contact 150F and the source/drain contact via 170E. In other words, another M0 metal line hangs over the gate structure 114 and provide the function of cross coupling between the gate contact 150F and the source/drain contact via 170E. Therefore, in the layout 100C, the gate contact 150F and the source/drain contact via 170E are positioned as being level in the Y-direction, such that a metal line extending in the X-direction may connect both.

On difference between the layout 100B as depicted in FIG. 8 and the layout 100C as depicted in FIG. 12 is: in the layout 100B, the gate contact 150A coupled to the read-port word line (R_WL) is disposed on the active region 104, and the gate contact 150F and the source/drain contact via 170E as belonged to the complimentary storage node (SNB) are disposed between the active region 102 and the active region 104; while in the layout 100C, the gate contact 150A coupled to the read-port word line (R_WL) is disposed between the active region 102 and the active region 104, and the gate contact 150F and the source/drain contact via 170E as belonged to the complimentary storage node (SNB) are disposed on the active region 104. State differently, in the layout 100B, along the Y-direction, the conductive features belonged to the complimentary storage node (SNB) is disposed between the conductive feature belonged to the storage node (SN) and the conductive feature coupled to the read-port word line (R_WL); while in the layout 100C, along the Y-direction, the conductive feature coupled to the read-port word line (R_WL) is disposed between the conductive features belonged to the storage node (SN) and the conductive feature belonged to the complimentary storage node (SNB).

FIG. 13 illustrates the via zero (V0) level and metal zero (M0) level of the layout 100C of the metal interconnect structures of the two-port SRAM cell 100. At the M0 level, the SRAM cell 100 includes a plurality of metal tracks arranged in parallel. Particularly, in the illustrated embodiment of the layout 100C, the SRAM cell 100 includes six metal tracks arranged in order from first (M0 Track 1) to sixth (M0 Track 6) along the Y-direction. The center lines of the metal tracks are represented by the dotted lines in FIG. 13.

In the layout 100C, the first metal track "M0 Track 1" includes a global metal line 280A, which is a Vss line electrically coupled to the source/drain contact via 170G. The Vss line 280A is disposed on an upper edge of the SRAM cell 100 and may be shared with an adjacent SRAM cell. The second metal track "M0 Track 2" includes a local metal line 280B as a pad for the write-port word line (W_WL). The local metal line 280B is fully within the SRAM cell 100 and electrically connects to the gate contact 150C and the gate contact 150D. The third metal track "M0 Track 3" includes three local metal lines 280C, 280D, and 280E. The local metal line 280C provides a pad for the write-port complimentary bit line (W_BLB). The local metal line 280C extends beyond a left edge of the SRAM cell 100 and may be shared with an adjacent SRAM cell. The local metal line 280D is fully within the SRAM cell 100, which belongs to the storage node (SN) and provides cross-coupling between the gate contact 150E and the source/drain contact via 170F. As discussed above, the local metal line 280D crosses over the gate structure 116. The local metal line 280E provides a pad for the write-port bit line (W_BL). The local metal line 280E extends beyond a right edge of the SRAM cell 100 and may be shared with an adjacent SRAM cell. The fourth metal track "M0 Track 4" includes two local metal lines 280F and 280G. The local metal line 280F is fully within the SRAM cell 100 and is electrically floating. Therefore, the local metal line 280F is a non-functional metal line, which is mainly for improving metal density uniformity in the layout. The local metal line 280G is fully within the SRAM cell 100 and provides a pad for the read-port word line (R_WL). The fifth metal track "M0 Track 5" includes three local metal lines 280H, 280I, and 280J. The local metal line 280H extends beyond a left edge of the SRAM cell 100 and may be shared with an adjacent SRAM cell. The local metal line 280H is electrically floating. Therefore, the local metal line 280H is a non-functional metal line, which is mainly for improving metal density uniformity in the layout. The local metal line 280I is fully within the SRAM cell 100, which belongs to the complementary storage node (SNB) and provides cross-coupling between the gate contact 150F and the source/drain contact via 170E. As discussed above, the local metal line 280I crosses over the gate structure 116. The local metal line 280J extends beyond a right edge of the SRAM cell 100 and may be shared with an adjacent SRAM cell. The local metal line 280J provides a pad for the read-port bit line (R_BL). The sixth metal track "M0 Track 6" includes a global metal line 280K, which is a VDD line electrically coupled to the source/drain contact via 170H. The VDD line 280K is disposed on a lower edge of the SRAM cell 100 and may be shared with an adjacent SRAM cell.

A width of the VSS line 280A is denoted as w1 with one half of w1 in one SRAM cell and another half of w1 in the adjacent SRAM cell. A width of the VDD line 280K may be substantially the same as the VSS line 280A with one half of w1 in one SRAM cell and another half of w1 in the adjacent SRAM cell. The other M0 metal lines 280B-280J may each have the same width denoted as w2. The spacing between two adjacent M0 metal lines may be uniform and denoted as s1. Thus, the SRAM cell height H equals w1+4*w2+5*s1. Compared with the layout 100B in which the SRAM cell heigh H is w1+5w2+6*s1, the layout 100C saves w2+s1 in the cell height H. The saving of w2+s1 in the cell height H origins from using six metal tracks instead of seven metal tracks in the M0 layout. Particularly, the functions of the M0 Track 4 and M0 Track 5 in the layout 100B (pad for SNB and line for RBL) are now merged into the M0 Track 5 in the layout 100C (pad for SNB and pad for RBL). The saving of one metal track may translate to a cell size reduction of about 10% to about 20%.

In some embodiments, a ratio of the length of the M0 metal line 280B (denoted as L1) and the poly pitch (denoted as P) ranges from about 2 to about 4 (i.e., 2<L1/P<4); a ratio of the length of the M0 metal line 280D (denoted as L2) and the poly pitch ranges from about 1.5 to about 3 (i.e., 1.5<L2/P<3); a ratio of the length of the M0 metal line 280I (denoted as L3) and the poly pitch ranges from about 1.5 to about 3 (i.e., 1.5<L3/P<3); a ratio of the length of the M0 metal line 280E (denoted as L4) and the poly pitch ranges from about 0.5 to about 2 (i.e., 0.5<L4/P<2); a ratio of the length of the M0 metal line 280J (denoted as L5) and the poly pitch ranges from about 0.5 to about 2 (i.e., 0.5<L5/

P<2); and a ratio of the length of the M0 metal line 280G (denoted as L6) and the poly pitch ranges from about 1 to about 2 (i.e., 1<L6/P<2).

FIG. 14 illustrates the via one (V1) level and metal one (M1) level of the layout 100C of the metal interconnect structures of the two-port SRAM cell 100. Also, for reasons of aiding visual clarity, M0 metal lines 280A-280K depicted in FIG. 13 are reproduced in FIG. 14. At the M1 level, the SRAM cell 100 includes a plurality of metal tracks arranged in parallel. Particularly, in the illustrated embodiment of the layout 100C, the SRAM cell 100 includes five metal tracks arranged in order from first (M1 Track 1) to fifth (M1 Track 5) along the X-direction. The center lines of the metal tracks are represented by the dotted lines in FIG. 14.

In the layout 100C, the first metal track "M1 Track 1" includes a local metal line 292A, which provides a pad for the write-port complimentary bit line (W_BLB) and electrically couples to the underneath M0 metal line 280C through the V1 via 290A. The second metal track "M1 Track 2" includes a global metal line 292B, which is the write-port word line (W_WL) and electrically couples to the underneath M0 metal line 280B (pad for W_WL) through V1 via 290B. The third metal track "M1 Track 3" includes a global metal line 292C, which is also a VSS line and electrically couples to the underneath M0 metal line 280A (VSS line) through V1 via 290C. The fourth metal track "M1 Track 4" includes a global metal line 292D, which is the read-port word line (R_WL) and electrically couples to the underneath M0 metal line 280G (pad for R_WL) through V1 via 290D. The fifth metal track "M1 Track 5" includes local metal lines 292E and 292F. The local metal line 292E provides a pad for the write-port bit line (W_BL) and electrically couples to the underneath M0 metal line 280E (pad for W_BL) through V1 via 290E. The local metal line 292F provides a pad for the read-port bit line (R_BL) and electrically couples to the underneath M0 metal line 280J (pad for R_BL) through V1 via 290F.

FIG. 15 illustrates the via two (V2) level and metal two (M2) level of the layout 100C of the metal interconnect structures of the two-port SRAM cell 100. Also, for reasons of aiding visual clarity, M1 metal lines 292A-292F depicted in FIG. 14 are reproduced in FIG. 15. At the M2 level, the SRAM cell 100 includes a plurality of metal tracks arranged in parallel. Particularly, in the illustrated embodiment of the layout 100C, the SRAM cell 100 includes four metal tracks arranged in order from first (M2 Track 1) to fourth (M2 Track 3) along the Y-direction. The center lines of the metal tracks are represented by the dotted lines in FIG. 11.

In the layout 100C, the first metal track "M2 Track 1" includes a global metal line 296A, which provides a write-port complimentary bit line (W_BLB) and electrically couples to the underneath M1 metal line 292A (pad for W_BLB) through V2 via 294A. The second metal track "M2 Track 2" includes a global metal line 296B, which is the write-port bit line (W_BL) and electrically couples to the underneath M1 metal line 292E (pad for W_BL) through V2 via 294B. The third metal track "M3 Track 3" includes a global metal line 296C that travels through the SRAM cell 100. The fourth metal track "M4 Track 4" includes a global metal line 296D, which provides a read-port bit line (R_BL) and electrically couples to the underneath M1 metal line 292F (pad for R_BL) through V2 via 294D. In the illustrated embodiment, the M2 metal lines 296A-296D are uniformly distributed with the same metal line width and spacing.

Figure 16:
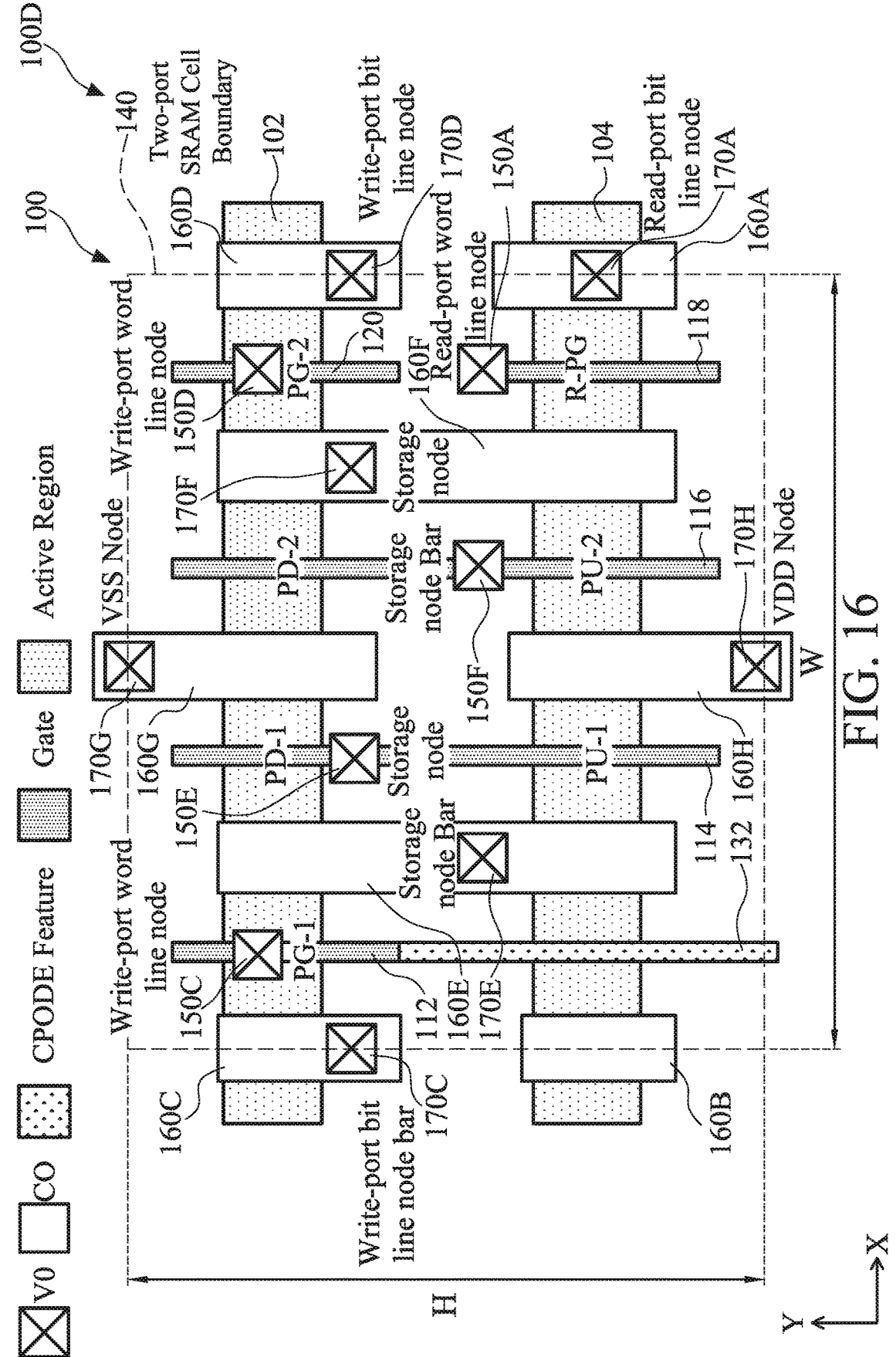
Figure 17:
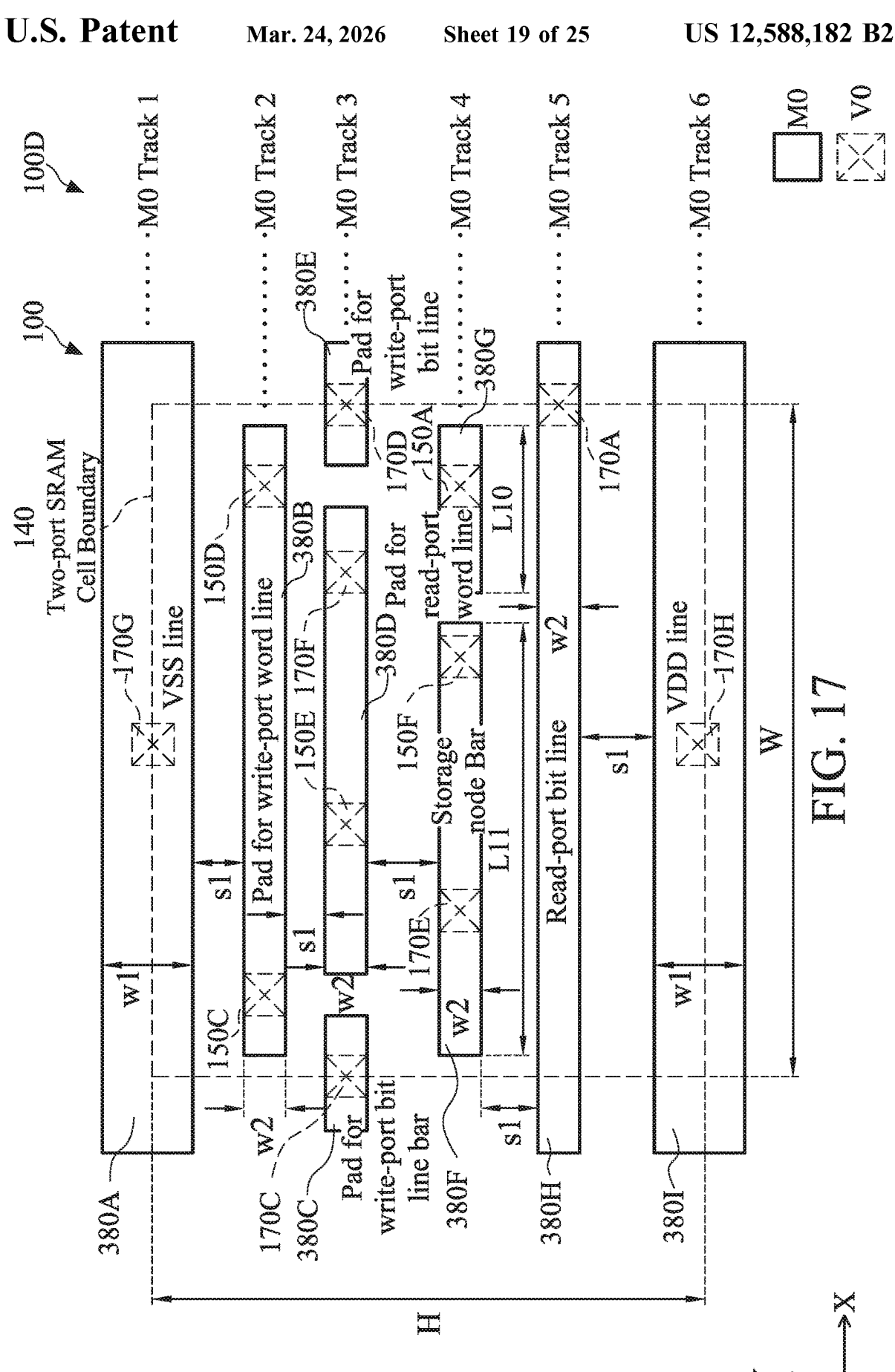
Figure 18:
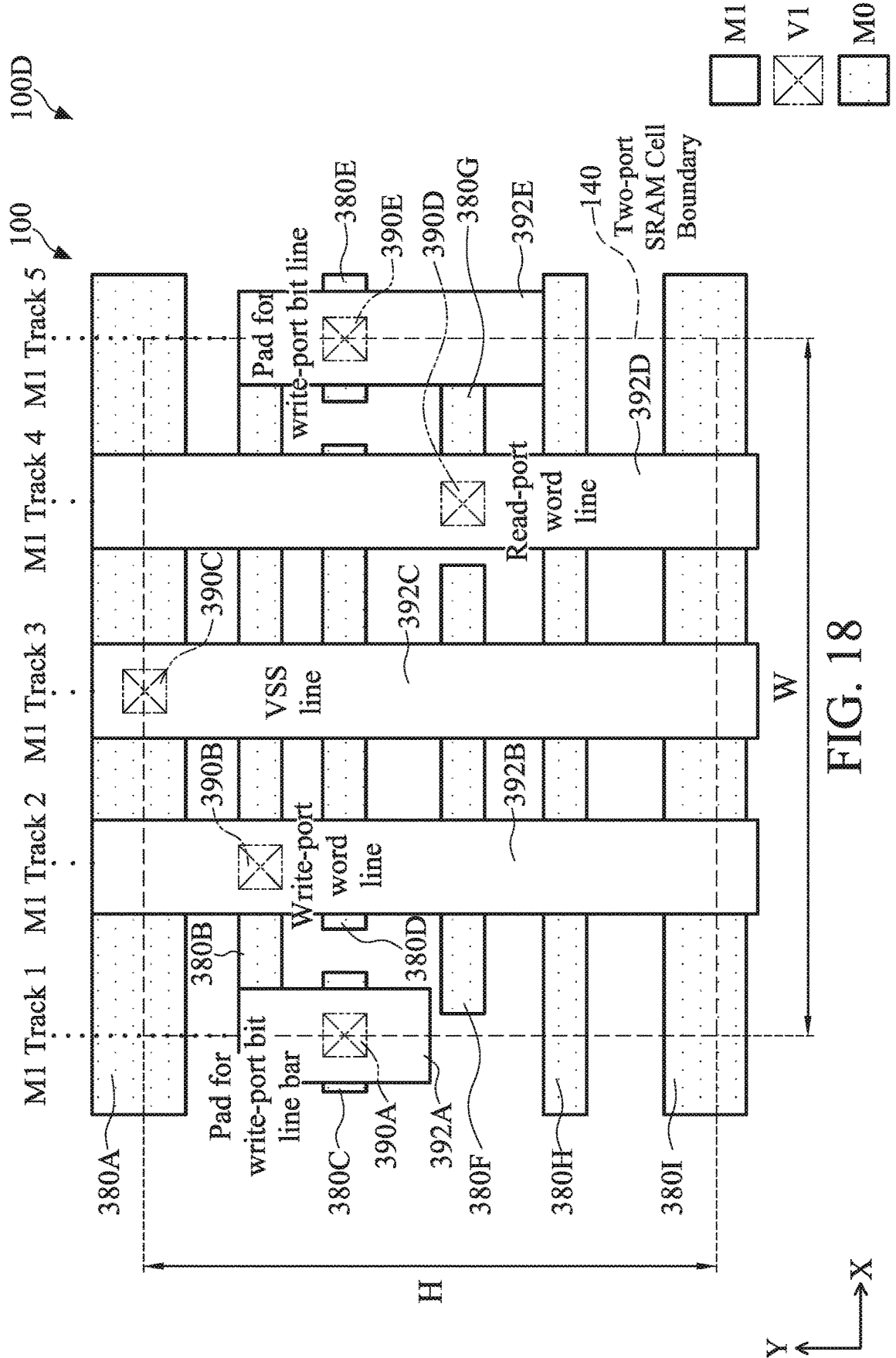

As an alternative embodiment of the metal interconnect structures, FIGS. 16, 17, 18, and 19 illustrate a simplified diagrammatic layout 100D at different layers of the metal interconnect structures of the two-port SRAM cell 100. Particularly, FIG. 16 illustrates the conductive features in the contact level (C0) and the via zero (V0) level, FIG. 17 illustrates the via zero (V0) level and the metal zero (M0) level, FIG. 18 illustrates the via one (V1) level and metal one (M1) level, and FIG. 19 illustrates the via two (V2) level and metal two (M2) level.

FIG. 16 depicts the conductive features in the contact level (C0) and the via zero (V0) level. Also, for reasons of aiding visual clarity, some features in the layout 100A devoted to the device layer DL are reproduced in FIG. 16, such as the active regions 102, 104, the gate structures 112-120, the CPODE feature 132, and the cell boundary 140, while numerous other features are omitted in FIG. 16.

A gate contact 150A electrically connects a gate of the read-port pass-gate transistor R-PG (formed by the gate structure 118) to the read-port word line node (R_WL). A gate contact 150C electrically connects a gate of the write-port pass-gate transistor PG-1 (formed by the gate structure 112) to the write-port word line node (W_WL). A gate contact 150D electrically connects a gate of the write-port pass-gate transistor PG-2 (formed by the gate structure 120) to the write-port word line node (W_WL). A gate contact 150E electrically connects a gate of the write-port pull-down transistor PD-1 (formed by the gate structure 114) and a gate of the write-port pull-up transistor PU-1 (also formed by the gate structure 114) to the storage node (SN). A gate contact 150F electrically connects a gate of the write-port pull-down transistor PD-2 (formed by the gate structure 116) and a gate of the write-port pull-up transistor PU-2 (also formed by the gate structure 116) to the complementary storage node (SNB).

A source/drain contact 160A and a source/drain contact via 170A landing thereon electrically connect a source region of the read-port pass-gate transistor R-PG to the read-port bit line node (R_BL). A source/drain contact 160B lands on a source/drain region adjacent to the CPODE feature 132 and stays electrically floating, as there is no corresponding source/drain contact via landing thereon. A source/drain contact 160C and a source/drain contact via 170C landing thereon electrically connect a source region of the write-port pass-gate transistor PG-1 to the write-port complementary bit line node (W_BLB). A source/drain contact 160D and a source/drain contact via 170D landing thereon electrically connect a source region of the write-port pass-gate transistor PG-2 to the write-port bit line node (W_BL). A source/drain contact 160E and a source/drain contact via 170E landing thereon electrically connect a common drain region of the write-port pass-gate transistor PG-1 and the write-port pull-down transistor PD-1 together with a drain region of the write-port pull-up transistor PU-1 to the complementary storage node (SNB). A source/drain contact 160F and a source/drain contact via 170F landing thereon electrically connect a common drain region of the write-port pass-gate transistor PG-2 and the write-port pull-down transistor PD-2 together with a common drain region of the write-port pull-up transistor PU-2 and the read-port pass-gate transistor R-PG to the storage node (SN). A source/drain contact 160G and a source/drain contact via 170G landing thereon electrically connect a common source region of the write-port pull-down transistor PD-1 and the write-port pull-down transistor PD-2 to the electrical ground node Vss. A source/drain contact 160H and a source/drain contact via 170H landing thereon electrically connect a common source region of the write-port pull-up transistor PU-1 and the write-port pull-up transistor PU-2 to the power voltage node VDD. In the illustrated embodiment, the source/drain contacts 160A-160H each are elongated and have a longitudinal direction in the Y-direction, which is parallel to the extending directions of gate structures.

As shown in FIG. 16, the storage node SN includes the gate contact 150E and the source/drain contact via 170F positioned on two opposing sides of the gate structure 116. As to discuss in further detail below, a metal line at the M0 level extends in the X-direction to across the gate structure 116 and connects the gate contact 150E and the source/drain contact via 170F. In other words, an M0 metal line hangs over the gate structure 116 and provide the function of cross coupling between the gate contact 150E and the source/drain contact via 170F. Therefore, in the layout 100D, the gate contact 150E and the source/drain contact via 170F are positioned as being level in the Y-direction, such that a metal line extending in the X-direction may connect both. Similarly, the complementary storage node (storage node bar) SNB includes the gate contact 150F and the source/drain contact via 170E positioned on two opposing sides of the gate structure 114. As to discuss in further detail below, another metal line at the M0 level extends in the X-direction to across the gate structure 114 and connects the gate contact 150F and the source/drain contact via 170E. In other words, another M0 metal line hangs over the gate structure 114 and provide the function of cross coupling between the gate contact 150F and the source/drain contact via 170E. Therefore, in the layout 100D, the gate contact 150F and the source/drain contact via 170E are positioned as being level in the Y-direction, such that a metal line extending in the X-direction may connect both.

On difference between the layout 100C as depicted in FIG. 12 and the layout 100D as depicted in FIG. 16 is: in the layout 100C, the gate contact 150F and the source/drain contact via 170E as belonged to the complimentary storage node (SNB) are disposed on the active region 104 and aligned to the source/drain contact via 170A along the X-direction; while in the layout 100D, the gate contact 150F and the source/drain contact via 170E as belonged to the complimentary storage node (SNB) are disposed between the active region 102 and the active region 104 and aligned to the gate contact 150A. State differently, in the layout 100C, along the Y-direction, the conductive feature coupled to the read-port word line (R_WL) is disposed between the conductive features belonged to the storage node (SN) and the conductive feature belonged to the complimentary storage node (SNB); while in the layout 100D, along the Y-direction, the conductive features belonged to the complimentary storage node (SNB) and the conductive feature coupled to the read-port word line (R_WL) are disposed between the conductive features belonged to the storage node (SN) and the conductive feature coupled to the read-port bit line (R_BL).

FIG. 17 illustrates the via zero (V0) level and metal zero (M0) level of the layout 100D of the metal interconnect structures of the two-port SRAM cell 100. At the M0 level, the SRAM cell 100 includes a plurality of metal tracks arranged in parallel. Particularly, in the illustrated embodiment of the layout 100D, the SRAM cell 100 includes six metal tracks arranged in order from first (M0 Track 1) to sixth (M0 Track 6) along the Y-direction. The center lines of the metal tracks are represented by the dotted lines in FIG. 17.

In the layout 100D, the first metal track "M0 Track 1" includes a global metal line 380A, which is a Vss line electrically coupled to the source/drain contact via 170G. The Vss line 380A is disposed on an upper edge of the SRAM cell 100 and may be shared with an adjacent SRAM cell. The second metal track "M0 Track 2" includes a local metal line 380B as a pad for the write-port word line (W_WL). The local metal line 380B is fully within the SRAM cell 100 and electrically connects to the gate contact 150C and the gate contact 150D. The third metal track "M0 Track 3" includes three local metal lines 380C, 380D, and 380E. The local metal line 380C provides a pad for the write-port complimentary bit line (W_BLB). The local metal line 380C extends beyond a left edge of the SRAM cell 100 and may be shared with an adjacent SRAM cell. The local metal line 380D is fully within the SRAM cell 100, which belongs to the storage node (SN) and provides cross-coupling between the gate contact 150E and the source/drain contact via 170F. As discussed above, the local metal line 380D crosses over the gate structure 116. The local metal line 380E provides a pad for the write-port bit line (W_BL). The local metal line 380E extends beyond a right edge of the SRAM cell 100 and may be shared with an adjacent SRAM cell. The fourth metal track "M0 Track 4" includes two local metal lines 380F and 380G. The local metal line 380F is fully within the SRAM cell 100, which belongs to the complementary storage node (SNB) and provides cross-coupling between the gate contact 150F and the source/drain contact via 170E. As discussed above, the local metal line 380F crosses over the gate structure 116. The local metal line 380G is fully within the SRAM cell 100 and provides a pad for the read-port word line (R_WL). The fifth metal track "M0 Track 5" includes a global metal line 380H, which is a red-port bit line (R_BL) and electrically couples to the source/drain contact via 170A. The sixth metal track "M0 Track 6" includes a global metal line 380I, which is a VDD line electrically coupled to the source/drain contact via 170H. The VDD line 380I is disposed on a lower edge of the SRAM cell 100 and may be shared with an adjacent SRAM cell.

A width of the VSS line 380A is denoted as w1 with one half of w1 in one SRAM cell and another half of w1 in the adjacent SRAM cell. A width of the VDD line 380I may be substantially the same as the VSS line 380A with one half of w1 in one SRAM cell and another half of w1 in the adjacent SRAM cell. The other M0 metal lines 380B-380H may each have the same width denoted as w2. The spacing between two adjacent M0 metal lines may be uniform and denoted as s1. Thus, the SRAM cell height H equals w1+4*w2+5*s1. Compared with the layout 100B in which the SRAM cell heigh H is w1+5w2+6*s1, the layout 100D saves w2+s1 in the cell height H. The saving of w2+s1 in the cell height H origins from using six metal tracks instead of seven metal tracks in the M0 layout. Particularly, the functions of the M0 Track 4 and M0 Track 6 in the layout 100B (pad for SNB and pad for RWL) are now merged into the M0 Track 4 in the layout 100D (pad for SNB and pad for RBL). The saving of one metal track may translate to a cell size reduction of about 10% to about 20%.

In some embodiments, a ratio of the length of the M0 metal line 380G (denoted as L10) and the poly pitch (denoted as P) ranges from about 0.7 to about 1.5 (i.e., 0.7<L10/P<1.5); a ratio of the length of the M0 metal line 380F (denoted as L11) and the poly pitch ranges from about 2 to about 3 (i.e., 2<L11/P<3).

FIG. 18 illustrates the via one (V1) level and metal one (M1) level of the layout 100D of the metal interconnect structures of the two-port SRAM cell 100. Also, for reasons of aiding visual clarity, M0 metal lines 380A-380I depicted in FIG. 17 are reproduced in FIG. 18. At the M1 level, the SRAM cell 100 includes a plurality of metal tracks arranged in parallel. Particularly, in the illustrated embodiment of the layout 100D, the SRAM cell 100 includes five metal tracks arranged in order from first (M1 Track 1) to fifth (M1 Track 5) along the X-direction. The center lines of the metal tracks are represented by the dotted lines in FIG. 18.

In the layout 100D, the first metal track "M1 Track 1" includes a local metal line 392A, which provides a pad for the write-port complimentary bit line (W_BLB) and electrically couples to the underneath M0 metal line 380C through the V1 via 390A. The second metal track "M1 Track 2" includes a global metal line 392B, which is the write-port word line (W_WL) and electrically couples to the underneath M0 metal line 380B (pad for W_WL) through V1 via 390B. The third metal track "M1 Track 3" includes a global metal line 392C, which is also a VSS line and electrically couples to the underneath M0 metal line 380A (VSS line) through V1 via 390C. The fourth metal track "M1 Track 4" includes a global metal line 392D, which is the read-port word line (R_WL) and electrically couples to the underneath M0 metal line 380G (pad for R_WL) through V1 via 390D. The fifth metal track "M1 Track 5" includes a local metal line 392E. The local metal line 392E provides a pad for the write-port bit line (W_BL) and electrically couples to the underneath M0 metal line 380E (pad for W_BL) through V1 via 390E.

FIG. 19 illustrates the via two (V2) level and metal two (M2) level of the layout 100D of the metal interconnect structures of the two-port SRAM cell 100. Also, for reasons of aiding visual clarity, M1 metal lines 392A-392E depicted in FIG. 18 are reproduced in FIG. 19. At the M2 level, the SRAM cell 100 includes a plurality of metal tracks arranged in parallel. Particularly, in the illustrated embodiment of the layout 100D, the SRAM cell 100 includes two metal tracks arranged in order from first (M2 Track 1) to second (M2 Track 2) along the Y-direction. The center lines of the metal tracks are represented by the dotted lines in FIG. 19.

In the layout 100D, the first metal track "M2 Track 1" includes a global metal line 396A, which provides a write-port complimentary bit line (W_BLB) and electrically couples to the underneath M1 metal line 392A (pad for W_BLB) through V2 via 394A. The second metal track "M2 Track 2" includes a global metal line 396B, which is the write-port bit line (W_BL) and electrically couples to the underneath M1 metal line 392E (pad for W_BL) through V2 via 394B. In the illustrated embodiment, the M2 metal lines 396A-296B are uniformly distributed with the same line width and spacing.

Figure 20:
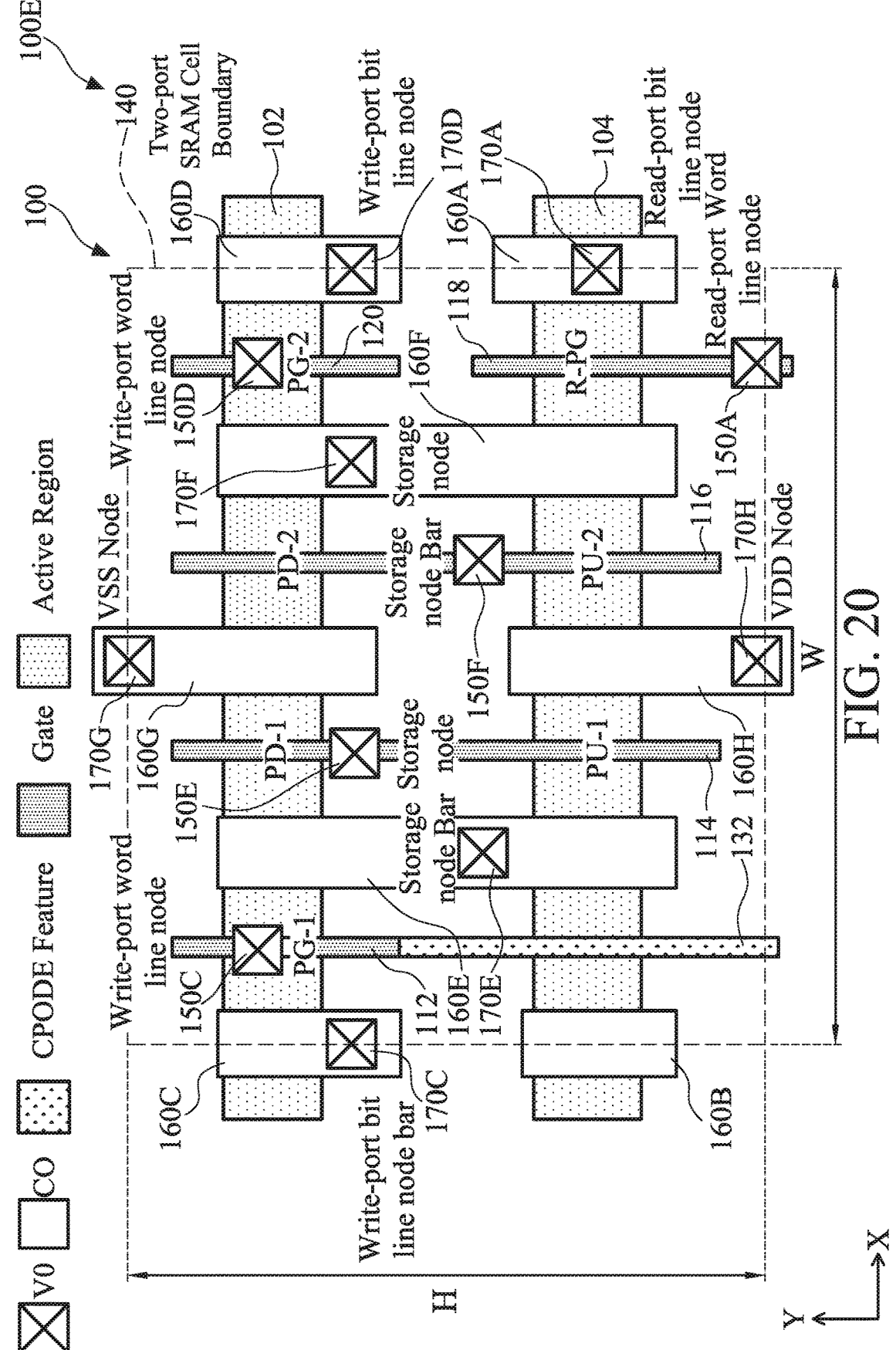
FIGS. 20, 21, 22, and 23 illustrate a fourth layout of metal interconnect structures of the two-port SRAM cell as in FIG. 3 at various contact and metal layers, in accordance with some embodiments of the present disclosure.
Figure 21:
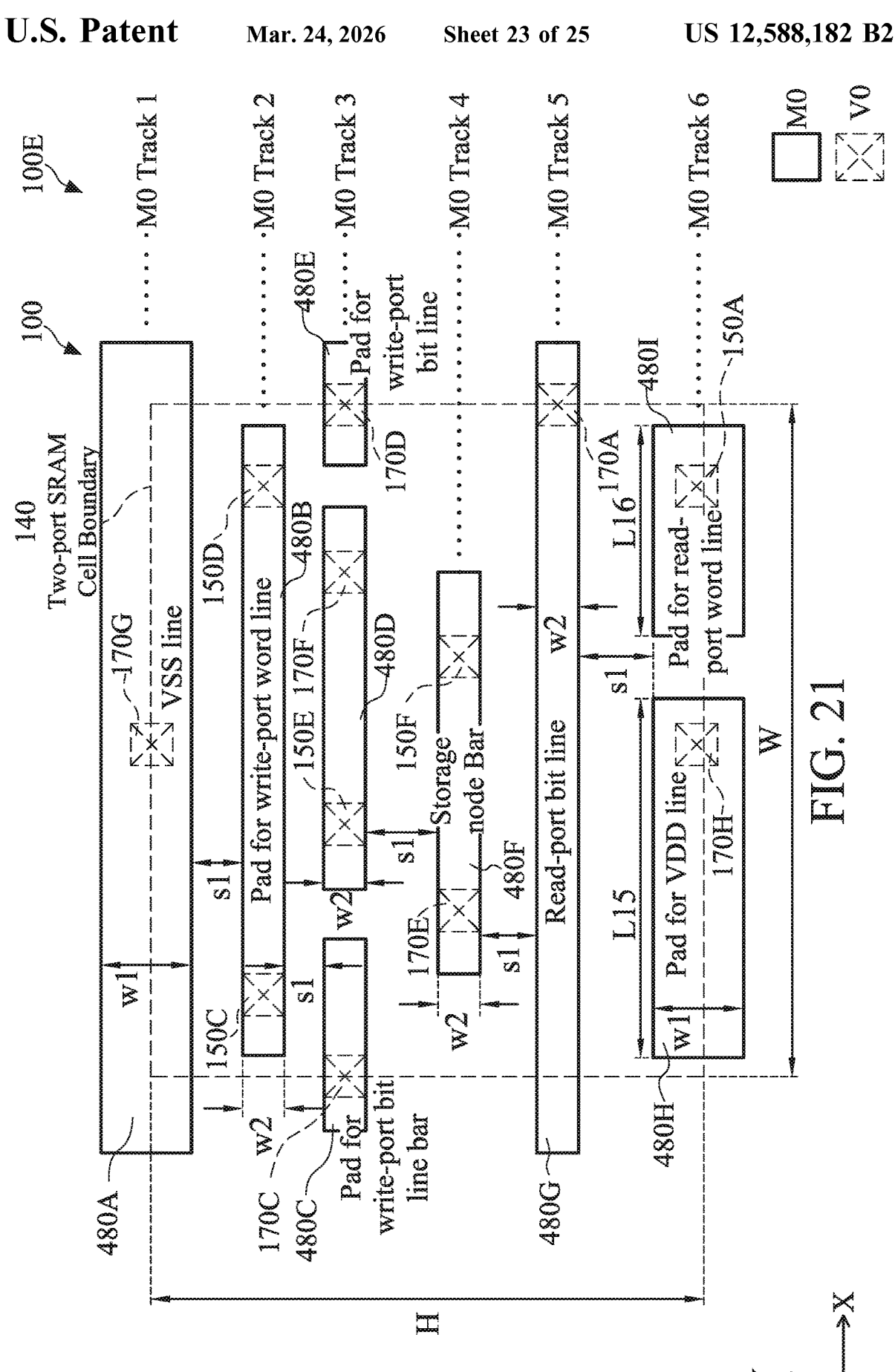
Figure 22:
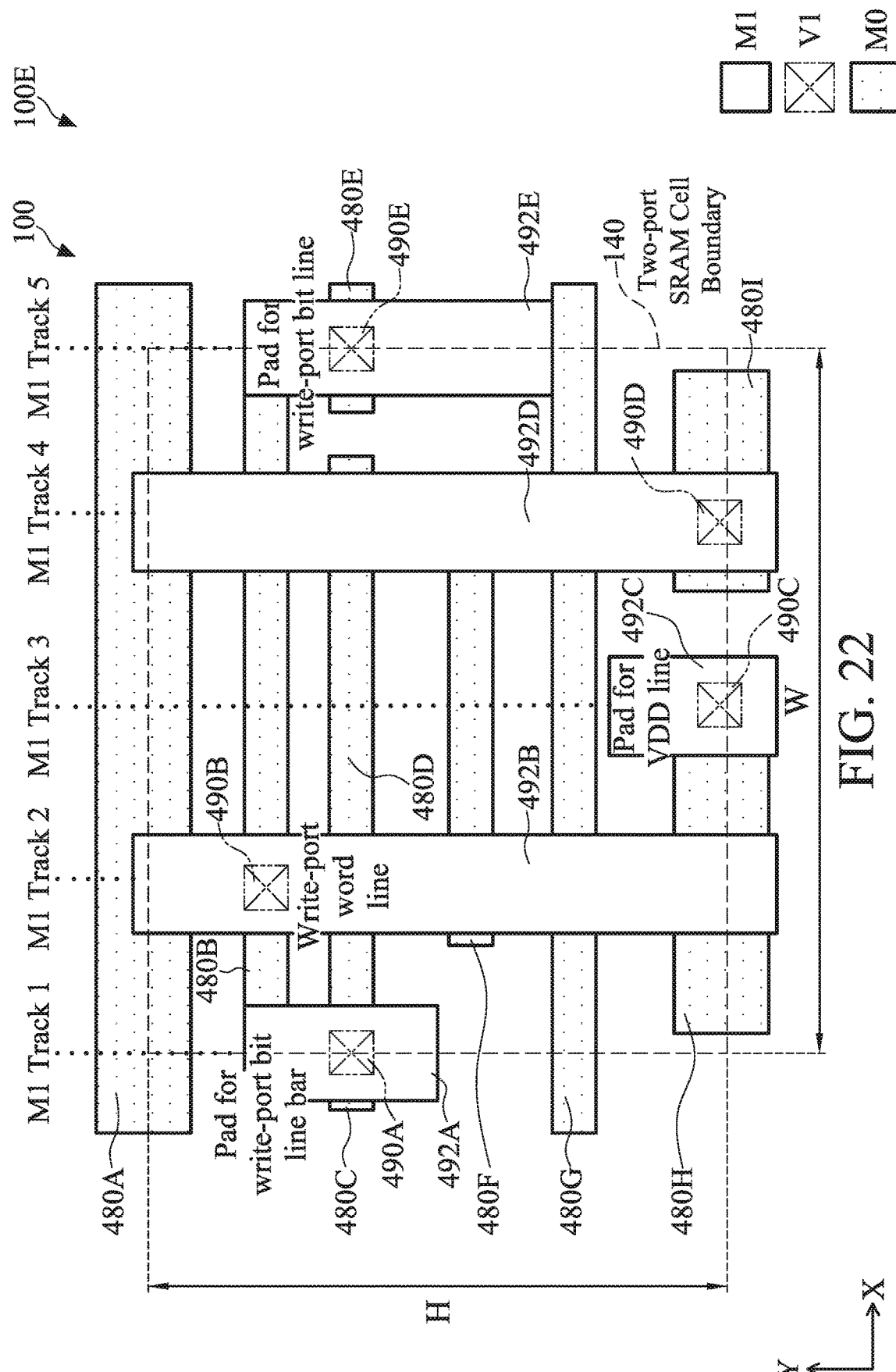
Figure 23:
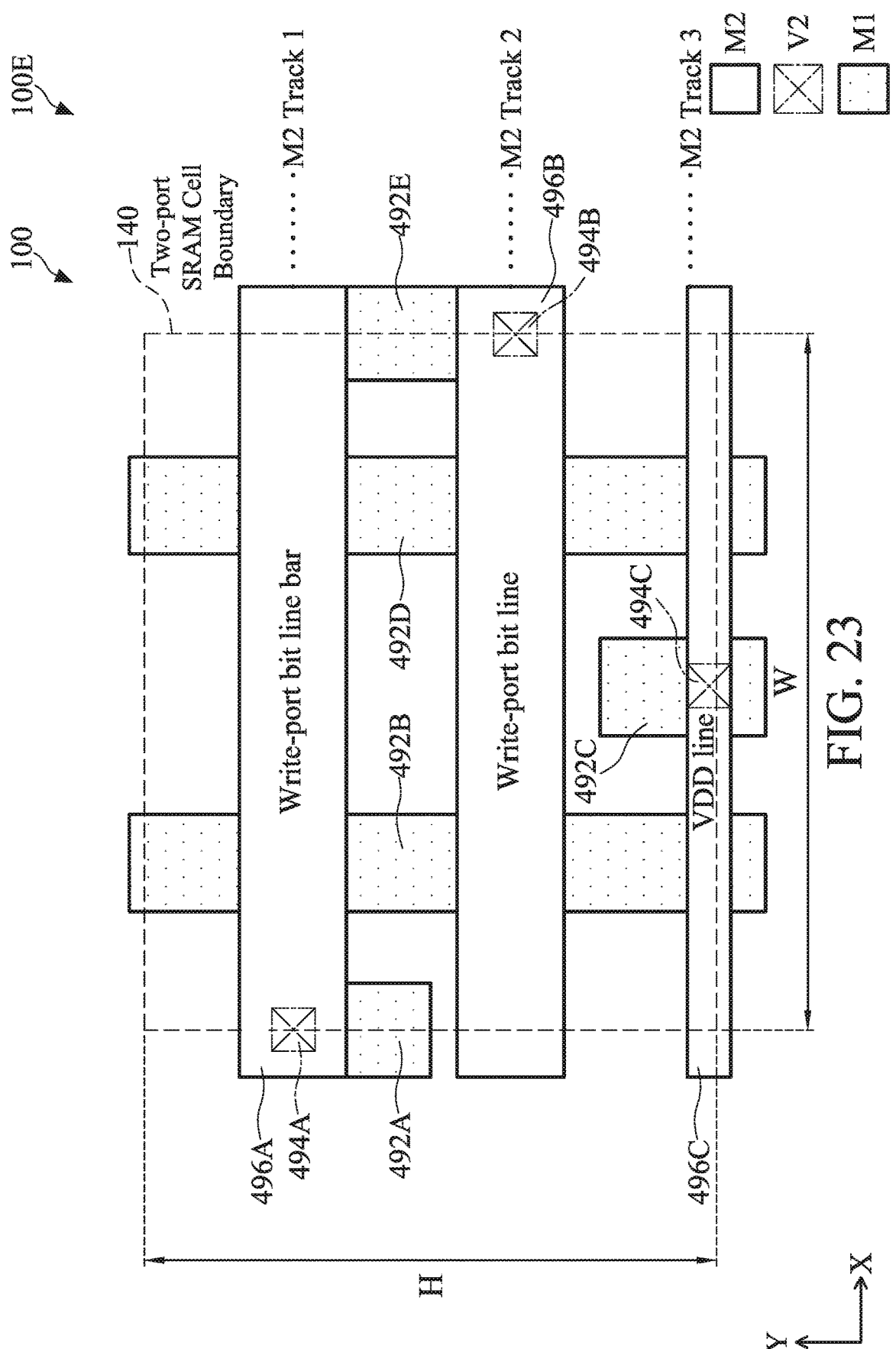

As an alternative embodiment of the metal interconnect structures, FIGS. 20, 21, 22, and 23 illustrate a simplified diagrammatic layout 100E at different layers of the metal interconnect structures of the two-port SRAM cell 100. Particularly, FIG. 20 illustrates the conductive features in the contact level (C0) and the via zero (V0) level, FIG. 21 illustrates the via zero (V0) level and the metal zero (M0) level, FIG. 22 illustrates the via one (V1) level and metal one (M1) level, and FIG. 23 illustrates the via two (V2) level and metal two (M2) level.

FIG. 20 depicts the conductive features in the contact level (C0) and the via zero (V0) level. Also, for reasons of aiding visual clarity, some features in the layout 100A devoted to the device layer DL are reproduced in FIG. 20, such as the active regions 102, 104, the gate structures 112-120, the CPODE feature 132, and the cell boundary 140, while numerous other features are omitted in FIG. 16.

A gate contact 150A electrically connects a gate of the read-port pass-gate transistor R-PG (formed by the gate structure 118) to the read-port word line node (R_WL). A gate contact 150C electrically connects a gate of the write-port pass-gate transistor PG-1 (formed by the gate structure 112) to the write-port word line node (W_WL). A gate contact 150D electrically connects a gate of the write-port pass-gate transistor PG-2 (formed by the gate structure 120) to the write-port word line node (W_WL). A gate contact 150E electrically connects a gate of the write-port pull-down transistor PD-1 (formed by the gate structure 114) and a gate of the write-port pull-up transistor PU-1 (also formed by the gate structure 114) to the storage node (SN). A gate contact 150F electrically connects a gate of the write-port pull-down transistor PD-2 (formed by the gate structure 116) and a gate of the write-port pull-up transistor PU-2 (also formed by the gate structure 116) to the complementary storage node (SNB).

A source/drain contact 160A and a source/drain contact via 170A landing thereon electrically connect a source region of the read-port pass-gate transistor R-PG to the read-port bit line node (R_BL). A source/drain contact 160B lands on a source/drain region adjacent to the CPODE feature 132 and stays electrically floating, as there is no corresponding source/drain contact via landing thereon. A source/drain contact 160C and a source/drain contact via 170C landing thereon electrically connect a source region of the write-port pass-gate transistor PG-1 to the write-port complementary bit line node (W_BLB). A source/drain contact 160D and a source/drain contact via 170D landing thereon electrically connect a source region of the write-port pass-gate transistor PG-2 to the write-port bit line node (W_BL). A source/drain contact 160E and a source/drain contact via 170E landing thereon electrically connect a common drain region of the write-port pass-gate transistor PG-1 and the write-port pull-down transistor PD-1 together with a drain region of the write-port pull-up transistor PU-1 to the complementary storage node (SNB). A source/drain contact 160F and a source/drain contact via 170F landing thereon electrically connect a common drain region of the write-port pass-gate transistor PG-2 and the write-port pull-down transistor PD-2 together with a common drain region of the write-port pull-up transistor PU-2 and the read-port pass-gate transistor R-PG to the storage node (SN). A source/drain contact 160G and a source/drain contact via 170G landing thereon electrically connect a common source region of the write-port pull-down transistor PD-1 and the write-port pull-down transistor PD-2 to the electrical ground node Vss. A source/drain contact 160H and a source/drain contact via 170H landing thereon electrically connect a common source region of the write-port pull-up transistor PU-1 and the write-port pull-up transistor PU-2 to the power voltage node VDD. In the illustrated embodiment, the source/drain contacts 160A-160H each are elongated and have a longitudinal direction in the Y-direction, which is parallel to the extending directions of gate structures.

As shown in FIG. 20, the storage node SN includes the gate contact 150E and the source/drain contact via 170F positioned on two opposing sides of the gate structure 116. As to discuss in further detail below, a metal line at the M0 level extends in the X-direction to across the gate structure 116 and connects the gate contact 150E and the source/drain contact via 170F. In other words, an M0 metal line hangs over the gate structure 116 and provide the function of cross coupling between the gate contact 150E and the source/drain contact via 170F. Therefore, in the layout 100E, the gate contact 150E and the source/drain contact via 170F are positioned as being level in the Y-direction, such that a metal line extending in the X-direction may connect both. Similarly, the complementary storage node (storage node bar) SNB includes the gate contact 150F and the source/drain contact via 170E positioned on two opposing sides of the gate structure 114. As to discuss in further detail below, another metal line at the M0 level extends in the X-direction to across the gate structure 114 and connects the gate contact 150F and the source/drain contact via 170E. In other words, another M0 metal line hangs over the gate structure 114 and provide the function of cross coupling between the gate contact 150F and the source/drain contact via 170E. Therefore, in the layout 100E, the gate contact 150F and the source/drain contact via 170E are positioned as being level in the Y-direction, such that a metal line extending in the X-direction may connect both.

On difference among the layout 100E as depicted in FIG. 20 and the other layouts 100B, 100C, 100D as depicted above is: in the layout 100E, the gate structure 118 for the transistor R-PG extends along the Y-direction across the boundary between the SRAM cell 100 and the adjacent SRAM cell (also as depicted in FIG. 6), which allows the gate contact 150A to be disposed on the lower edge of the SRAM cell 100.

FIG. 21 illustrates the via zero (V0) level and metal zero (M0) level of the layout 100E of the metal interconnect structures of the two-port SRAM cell 100. At the M0 level, the SRAM cell 100 includes a plurality of metal tracks arranged in parallel. Particularly, in the illustrated embodiment of the layout 100E, the SRAM cell 100 includes six metal tracks arranged in order from first (M0 Track 1) to sixth (M0 Track 6) along the Y-direction. The center lines of the metal tracks are represented by the dotted lines in FIG. 21.

In the layout 100E, the first metal track "M0 Track 1" includes a global metal line 480A, which is a Vss line electrically coupled to the source/drain contact via 170G. The Vss line 480A is disposed on an upper edge of the SRAM cell 100 and may be shared with an adjacent SRAM cell. The second metal track "M0 Track 2" includes a local metal line 480B as a pad for the write-port word line (W_WL). The local metal line 480B is fully within the SRAM cell 100 and electrically connects to the gate contact 150C and the gate contact 150D. The third metal track "M0 Track 3" includes three local metal lines 480C, 480D, and 480E. The local metal line 480C provides a pad for the write-port complimentary bit line (W_BLB). The local metal line 480C extends beyond a left edge of the SRAM cell 100 and may be shared with an adjacent SRAM cell. The local metal line 480D is fully within the SRAM cell 100, which belongs to the storage node (SN) and provides cross-coupling between the gate contact 150E and the source/drain contact via 170F. As discussed above, the local metal line 480D crosses over the gate structure 116. The local metal line 480E provides a pad for the write-port bit line (W_BL). The local metal line 480E extends beyond a right edge of the SRAM cell 100 and may be shared with an adjacent SRAM cell. The fourth metal track "M0 Track 4" includes a local metal line 480F. The local metal line 480F is fully within the SRAM cell 100, which belongs to the complementary storage node (SNB) and provides cross-coupling between the gate contact 150F and the source/drain contact via 170E. As discussed above, the local metal line 480F crosses over the gate structure 116. The fifth metal track "M0 Track 5" includes a global metal line 480G, which is a red-port bit line (R_BL) and electrically couples to the source/drain contact via 170A. The sixth metal track "M0 Track 6" includes local metal lines 480H and 480I. The local metal line 480H provides a pad for VDD line, which is electrically coupled to the source/drain contact via 170H. The local metal line 480H is disposed on a lower edge of the SRAM cell 100 and may be shared with an adjacent SRAM cell. The local metal line 480I provides a pad for the read-port word line (R_WL), which is electrically coupled to the gate contact 150A. The local metal line 480I is disposed on a lower edge of the SRAM cell 100 and may be shared with an adjacent SRAM cell.

A width of the VSS line 480A is denoted as w1 with one half of w1 in one SRAM cell and another half of w1 in the adjacent SRAM cell. A width of the pad for the VDD line 480H and a width of the pad for the read-port word line 480I may be substantially the same as the VSS line 480A with one half of w1 in one SRAM cell and another half of w1 in the adjacent SRAM cell. The other M0 metal lines 480B-480G may each have the same width denoted as w2. The spacing between two adjacent M0 metal lines may be uniform and denoted as s1. Thus, the SRAM cell height H equals w1+4*w2+5*s1. Compared with the layout 100B in which the SRAM cell heigh H is w1+5w2+6*s1, the layout 100E saves w2+s1 in the cell height H. The saving of w2+s1 in the cell height H origins from using six metal tracks instead of seven metal tracks in the M0 layout. Particularly, the functions of the M0 Track 6 and M0 Track 7 in the layout 100B (pad for RWL and line for VDD) are now merged into the M0 Track 6 in the layout 100E (pad for RWL and pad for VDD). The saving of one metal track may translate to a cell size reduction of about 10% to about 20%.

In some embodiments, a ratio of the length of the M0 metal line 480H (denoted as L15) and the poly pitch (denoted as P) ranges from about 0.1 to about 3 (i.e., $0.1 < L15/P < 3$); a ratio of the length of the M0 metal line 480I (denoted as L16) and the poly pitch ranges from about 0.1 to about 2 (i.e., $0.1 < L16/P < 2$).

FIG. 22 illustrates the via one (V1) level and metal one (M1) level of the layout 100E of the metal interconnect structures of the two-port SRAM cell 100. Also, for reasons of aiding visual clarity, M0 metal lines 480A-480I depicted in FIG. 21 are reproduced in FIG. 22. At the M1 level, the SRAM cell 100 includes a plurality of metal tracks arranged in parallel. Particularly, in the illustrated embodiment of the layout 100E, the SRAM cell 100 includes five metal tracks arranged in order from first (M1 Track 1) to fifth (M1 Track 5) along the X-direction. The center lines of the metal tracks are represented by the dotted lines in FIG. 22.

In the layout 100E, the first metal track "M1 Track 1" includes a local metal line 492A, which provides a pad for the write-port complimentary bit line (W_BLB) and electrically couples to the underneath M0 metal line 480C through the V1 via 490A. The second metal track "M1 Track 2" includes a global metal line 492B, which is the write-port word line (W_WL) and electrically couples to the underneath M0 metal line 480B (pad for W_WL) through V1 via 490B. The third metal track "M1 Track 3" includes a local metal line 492C, which provides a pad for the VDD line and electrically couples to the underneath M0 metal line 480H (pad for VDD) through V1 via 490C. The fourth metal track "M1 Track 4" includes a global metal line 492D, which is the read-port word line (R_WL) and electrically couples to the underneath M0 metal line 480I (pad for R_WL) through V1 via 490D. The fifth metal track "M1 Track 5" includes a local metal line 492E. The local metal line 492E provides a pad for the write-port bit line (W_BL) and electrically couples to the underneath M0 metal line 480E (pad for W_BL) through V1 via 490E.

FIG. 23 illustrates the via two (V2) level and metal two (M2) level of the layout 100E of the metal interconnect structures of the two-port SRAM cell 100. Also, for reasons of aiding visual clarity, M1 metal lines 492A-492E depicted in FIG. 22 are reproduced in FIG. 23. At the M2 level, the SRAM cell 100 includes a plurality of metal tracks arranged in parallel. Particularly, in the illustrated embodiment of the layout 100E, the SRAM cell 100 includes three metal tracks arranged in order from first (M2 Track 1) to third (M2 Track 3) along the Y-direction. The center lines of the metal tracks are represented by the dotted lines in FIG. 23.

In the layout 100E, the first metal track "M2 Track 1" includes a global metal line 496A, which provides a write-port complementary bit line (W_BLB) and electrically couples to the underneath M1 metal line 492A (pad for W_BLB) through V2 via 494A. The second metal track "M2 Track 2" includes a global metal line 496B, which is the write-port bit line (W_BL) and electrically couples to the underneath M1 metal line 492E (pad for W_BL) through V2 via 494B. The second metal track "M2 Track 3" includes a global metal line 496C, which is the VDD line and electrically couples to the underneath M1 metal line 492C (pad for VDD) through V2 via 494C. The global metal line 496C is disposed on the lower edge of the SRAM cell 100 and shared by the adjacent SRAM cell. In the illustrated embodiment, the M2 metal lines 496A and 496B have the same line width, which is larger than the line width of the M2 metal line 494C.

The multi-port SRAM cell and the corresponding layout illustrated in various exemplary embodiments of the present disclosure provide better cell area utilization, which in turn shrinks a cell size needed to implement a multi-port SRAM cell. In some embodiments, the layout designs of the metal interconnect structures indicate a two-port (2P) SRAM cell with merely six metal zero (M0) tracks to fit within the cell height. Further, embodiments of the present disclosure can be readily integrated into existing semiconductor manufacturing processes.

In one exemplary aspect, the present disclosure is directed to a memory cell. The memory cell includes a device layer including a plurality of transistors, each of the transistors including a gate structure extending lengthwise in a first direction, and an interconnect structure disposed over the device layer. The interconnect structure includes a bottom-most metal line layer electrically coupled to the transistors in the device layer. The bottommost metal line layer includes metal lines arranged in first, second, third, fourth, fifth, and sixth metal tracks in order from first to sixth along the first direction. A distance between any adjacent two of the first, second, third, fourth, fifth, and six metal tracks measured along the first direction is uniform. The first metal track includes a metal line electrically coupled to an electric ground of the memory cell. The sixth metal track includes a metal line electrically coupled to a power supply of the memory cell. In some embodiments, the memory cell includes a write-port and a read-port, and the fifth metal track includes a metal line coupled to a read-port bit line of the memory cell. In some embodiments, the metal line of the fifth metal track extends entirely through a boundary of the memory cell in a second direction perpendicular to the first direction. In some embodiments, the metal line of the fifth metal track is configured as a landing pad coupled to the read-port bit line. In some embodiments, the metal line of the sixth metal track is configured as a landing pad coupled to the power supply. In some embodiments, the sixth metal track includes another metal line configured as a landing pad coupled to a read-port word line of the memory cell. In some embodiments, the memory cell includes a storage node and a complementary storage node, and the third metal track includes a metal line coupled to the storage node. In some embodiments, the fourth metal track includes a metal line coupled to the complementary storage node. In some embodiments, the fifth metal track includes a metal line coupled to the complementary storage node. In some embodiments, the metal line of the third metal track crosses over the gate structure of one of the transistors that has a gate contact coupled to the complementary storage node.

In another exemplary aspect, the present disclosure is directed to an integrated circuit structure. The integrated circuit structure includes a device layer including a first gate structure of a first pass-gate transistor, a second gate structure shared by a first pull-down transistor and a first pull-up transistor, a third gate structure shared by a second pull-down transistor and a second pull-up transistor, and a fourth gate structure of a second pass-gate transistor, each of the gate structures extending lengthwise in a first direction, and a metal layer suspended above the device layer, the metal layer including first, second, third, fourth, fifth, and sixth metal tracks arranged in order from first to sixth along the first direction and each extending lengthwise in a second direction perpendicular to the first direction. The third metal track includes a metal line crossing over the third gate structure, and one of the fourth metal track or the fifth metal track includes a metal line crossing over the second gate structure. In some embodiments, the fifth metal track includes the metal line crossing over the second gate structure, and the fourth metal track includes a metal island that is electrically floating. In some embodiments, the fourth metal track includes the metal line crossing over the second gate structure, the metal line of the fourth metal track electrically coupled to the third gate structure, and the metal line of the third metal track electrically coupled to the second gate structure. In some embodiments, the first and sixth metal tracks include metal lines coupled to a power supply and an electric ground of the device layer. In some embodiments, the device layer further includes a fifth gate structure of a third pass-gate transistor, the first and second pass-gate transistors are of a first conductivity type, and the third pass-gate transistor is of a second conductivity type opposite to the first conductivity type. In some embodiments, the sixth metal track includes a metal line coupled to the fifth gate structure. In some embodiments, the fourth metal track includes a metal line coupled to the fifth gate structure.

In yet another exemplary aspect, the present disclosure is directed to a memory array. The memory array includes a first memory cell having at least a first transistor, a second memory cell having at least a second transistor, the second memory cell abutting the first memory cell, the first and second transistors sharing a gate structure that extends across a boundary line between the first and second memory cells, a gate contact disposed on the gate structure, and a metal track suspended above the boundary line, the metal track including a first pad coupled to a power supply of the first and second memory cells and a second pad in physical contact with the gate contact. In some embodiments, the first memory cell includes a write-port and a read-port, the second memory cell includes a write-port and a read-port, the first transistor is a pass-gate transistor of the read-port of the first memory cell, and the second transistor is a pass-gate transistor of the read-port of the second memory cell. In some embodiments, the metal track is a first metal track, the memory array also includes a second metal track suspended above the first metal track, the second metal track including a third pad coupled to the first pad through a first via, and a third metal track suspended above the second metal track, the third metal track including a power supply line coupled to the third pad through a second via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
a device layer including a plurality of transistors, wherein each of the transistors includes a gate structure extending lengthwise in a first direction; and
an interconnect structure disposed over the device layer, wherein:
the interconnect structure includes a bottommost metal line layer electrically coupled to the transistors in the device layer,
the bottommost metal line layer includes metal lines arranged in first, second, third, fourth, fifth, and sixth metal tracks in order from first to sixth along the first direction,
a distance between any adjacent two of the first, second, third, fourth, fifth, and six metal tracks measured along the first direction is uniform,
the first metal track includes a metal line electrically coupled to an electric ground of the memory cell, and
the sixth metal track includes a metal line electrically coupled to a power supply of the memory cell.

2. The memory cell of claim 1, wherein the memory cell includes a write-port and a read-port, and the fifth metal track includes a metal line coupled to a read-port bit line of the memory cell.

3. The memory cell of claim 2, wherein the metal line of the fifth metal track extends entirely through a boundary of the memory cell in a second direction perpendicular to the first direction.

4. The memory cell of claim 2, wherein the metal line of the fifth metal track is configured as a landing pad coupled to the read-port bit line.

5. The memory cell of claim 1, wherein the metal line of the sixth metal track is configured as a landing pad coupled to the power supply.

6. The memory cell of claim 5, wherein the sixth metal track includes another metal line configured as a landing pad coupled to a read-port word line of the memory cell.

7. The memory cell of claim 1, wherein the memory cell includes a storage node and a complementary storage node, and the third metal track includes a metal line coupled to the storage node.

8. The memory cell of claim 7, wherein the fourth metal track includes a metal line coupled to the complementary storage node.

9. The memory cell of claim 7, wherein the fifth metal track includes a metal line coupled to the complementary storage node.

10. The memory cell of claim 7, wherein the metal line of the third metal track crosses over the gate structure of one of the transistors that has a gate contact coupled to the complementary storage node.

11. An integrated circuit structure, comprising:
a device layer including a first gate structure of a first pass-gate transistor, a second gate structure shared by a first pull-down transistor and a first pull-up transistor, a third gate structure shared by a second pull-down transistor and a second pull-up transistor, and a fourth gate structure of a second pass-gate transistor, each of the gate structures extending lengthwise in a first direction; and
a metal layer suspended above the device layer, the metal layer including first, second, third, fourth, fifth, and sixth metal tracks arranged in order from first to sixth along the first direction and each extending lengthwise in a second direction perpendicular to the first direction,
wherein the third metal track includes a metal line crossing over the third gate structure, and one of the fourth metal track or the fifth metal track includes a metal line crossing over the second gate structure.

12. The integrated circuit structure of claim 11, wherein the fifth metal track includes the metal line crossing over the second gate structure, and the fourth metal track includes a metal island that is electrically floating.

13. The integrated circuit structure of claim 11, wherein the fourth metal track includes the metal line crossing over the second gate structure, the metal line of the fourth metal track electrically coupled to the third gate structure, and the metal line of the third metal track electrically coupled to the second gate structure.

14. The integrated circuit structure of claim 11, wherein the first and sixth metal tracks include metal lines coupled to a power supply and an electric ground of the device layer.

15. The integrated circuit structure of claim 11, wherein the device layer further includes a fifth gate structure of a third pass-gate transistor, the first and second pass-gate transistors are of a first conductivity type, and the third pass-gate transistor is of a second conductivity type opposite to the first conductivity type.

16. The integrated circuit structure of claim 15, wherein the sixth metal track includes a metal line coupled to the fifth gate structure.

17. The integrated circuit structure of claim 15, wherein the fourth metal track includes a metal line coupled to the fifth gate structure.

18. A memory array, comprising:
a first memory cell having at least a first transistor;
a second memory cell having at least a second transistor, the second memory cell abutting the first memory cell, wherein the first and second transistors share a gate structure that extends across a boundary line between the first and second memory cells;
a gate contact disposed on the gate structure; and
a metal track suspended above the boundary line, wherein the metal track includes a first pad coupled to a power supply of the first and second memory cells and a second pad in physical contact with the gate contact.

19. The memory array of claim 18, wherein:
the first memory cell includes a write-port and a read-port,
the second memory cell includes a write-port and a read-port,
the first transistor is a pass-gate transistor of the read-port of the first memory cell, and
the second transistor is a pass-gate transistor of the read-port of the second memory cell.

20. The memory array of claim 18, wherein the metal track is a first metal track, the memory array further comprising:

a second metal track suspended above the first metal track, the second metal track including a third pad coupled to the first pad through a first via; and a third metal track suspended above the second metal track, the third metal track including a power supply line coupled to the third pad through a second via.

* * * * *